(12) United States Patent
Komatsu

(10) Patent No.: US 8,391,074 B2
(45) Date of Patent: Mar. 5, 2013

(54) SEMICONDUCTOR MEMORY DEVICE AND DATA WRITE METHOD THEREOF

(75) Inventor: Yukio Komatsu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/525,978

(22) Filed: Jun. 18, 2012

(65) Prior Publication Data

US 2012/0257456 A1 Oct. 11, 2012

Related U.S. Application Data

(63) Continuation of application No. 13/099,962, filed on May 3, 2011, now Pat. No. 8,223,557, which is a continuation of application No. 12/535,040, filed on Aug. 4, 2009, now Pat. No. 7,948,804.

(30) Foreign Application Priority Data

Sep. 8, 2008 (JP) .................................. 2008-230295

(51) Int. Cl.
   *G11C 13/06* (2006.01)
(52) U.S. Cl. .......... 365/185.22; 365/185.03; 365/185.28
(58) Field of Classification Search ............. 365/185.03, 365/185.22, 185.28
   See application file for complete search history.

(56) References Cited

U.S. PATENT DOCUMENTS

| | | | |
|---|---|---|---|
| 5,539,690 A | 7/1996 | Talreja et al. | |
| 5,596,526 A | 1/1997 | Assar et al. | |
| 5,757,699 A | 5/1998 | Takeshima et al. | |
| 5,892,710 A | 4/1999 | Fazio et al. | |
| 6,028,792 A | 2/2000 | Tanaka et al. | |
| 6,507,518 B2 | 1/2003 | Hosono et al. | |
| 7,073,103 B2 | 7/2006 | Gongwer et al. | |
| 7,948,804 B2 | 5/2011 | Komatsu | |
| 2004/0156239 A1 | 8/2004 | Funaki | |
| 2007/0234144 A1 | 10/2007 | Gongwer et al. | |
| 2007/0297236 A1 | 12/2007 | Tokiwa | |
| 2008/0198659 A1 | 8/2008 | Honma et al. | |
| 2009/0213652 A1* | 8/2009 | Park et al. ................ | 365/185.03 |

FOREIGN PATENT DOCUMENTS

| | | |
|---|---|---|
| JP | 2000-163976 A | 6/2000 |
| JP | 2002-140899 | 5/2002 |
| JP | 2006-509326 | 3/2006 |
| JP | 2006-294126 | 10/2006 |
| JP | 2007-66386 | 3/2007 |
| JP | 2009-533794 | 9/2009 |

(Continued)

OTHER PUBLICATIONS

European Search Report issued Apr. 22, 1999, in European Patent Application No. EP 98 10 1617.

(Continued)

*Primary Examiner* — Hoai V Ho
(74) *Attorney, Agent, or Firm* — Oblon, Spivak, McClelland, Maier & Neustadt, L.L.P.

(57) ABSTRACT

A semiconductor memory device includes a control circuit. The control circuit executes control to perform a verify operation with respect to only a lowest threshold voltage level of a memory cell at a time of a data write operation, and to skip the verify operation with respect to the other threshold voltage levels. The control circuit determines whether a verify pass bit number of the lowest threshold voltage level, which is counted by a bit scan circuit, is a prescribed bit number or more, and the control circuit further executes control, if the verify pass bit number is the prescribed bit number or more, to perform the verify operation with respect to only the lowest threshold voltage level and a threshold voltage level that is higher than the lowest threshold voltage level, and to skip the verify operation with respect to the other threshold voltage levels.

18 Claims, 25 Drawing Sheets

FOREIGN PATENT DOCUMENTS

JP 2010-519673 6/2010
WO WO 2007/076512 A2 7/2007

OTHER PUBLICATIONS

Young-Joon Choi, et al., "A High Speed Programming Scheme for Multi-Level NAND Flash Memory", 1996 Symposium on VLSI Circuits. Digest of Technical Papers, No. SYMP. 10, XP-000639052, Jun. 13-15, 1996, pp. 170-171.

Tae-Sung Jung, et al., "A 117-mm$^2$ 3.3-V Only 128-Mb Multilevel NAND Flash Memory for Mass Storage Applications", IEEE Journal of solid-state circuits, vol. 31, No. 11, XP-000691441, Nov. 1996, pp. 1575-1583.

Japanese Office Action, mailed Sep. 4, 2012 in Japanese Application No. 2008-230295 (with English translation).

* cited by examiner

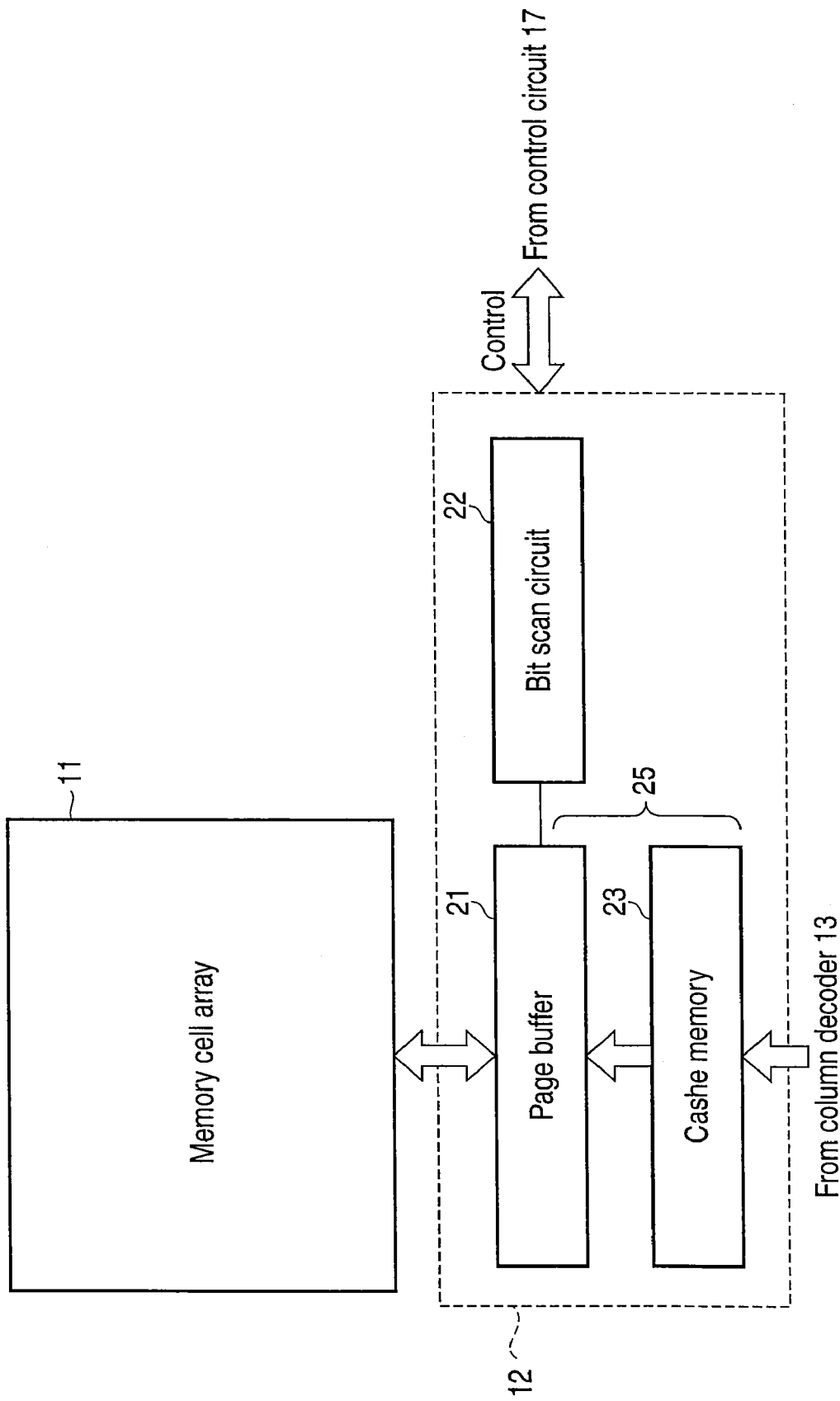
F I G. 2

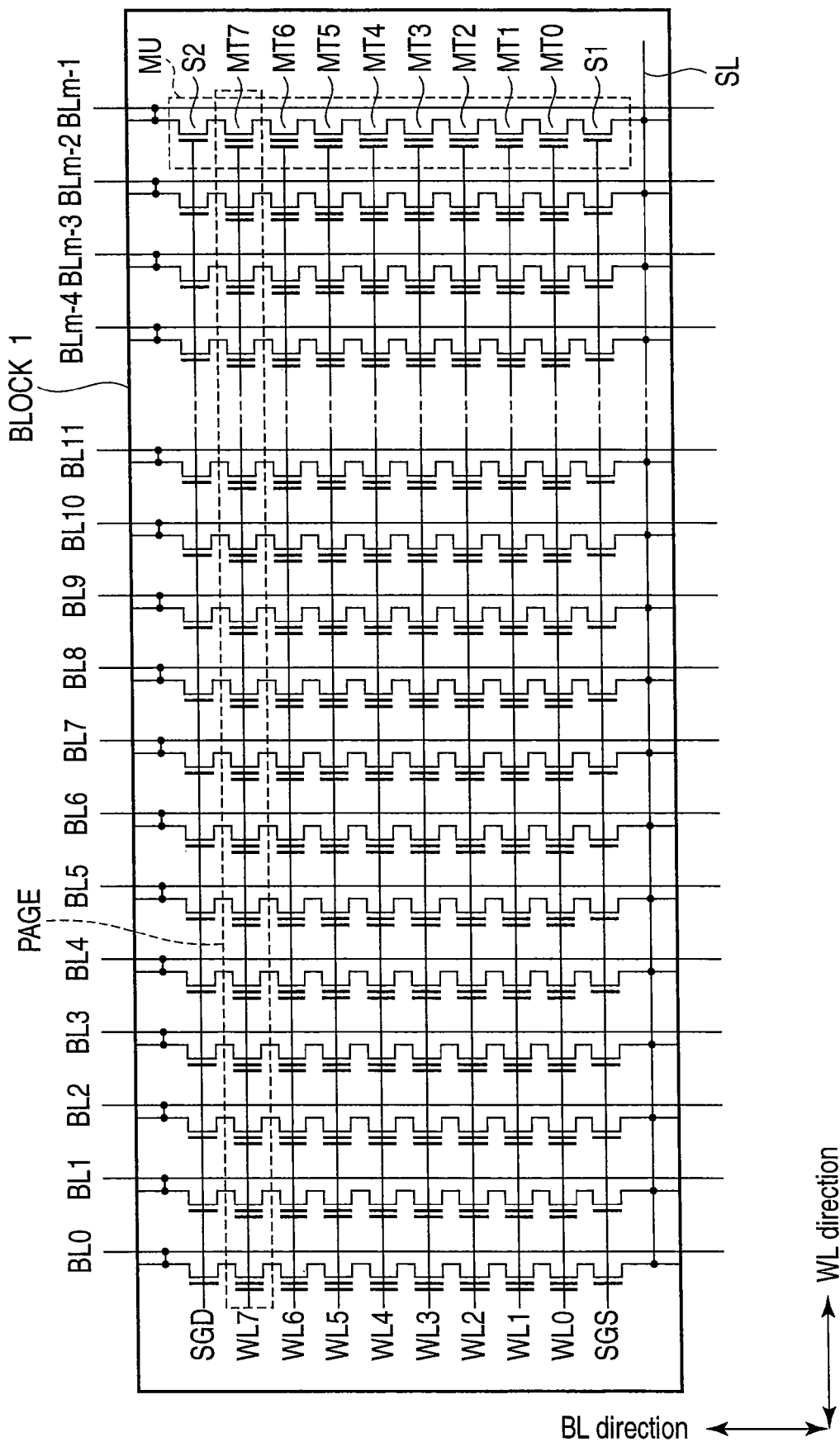
F I G. 3

FIG. 14

Verify at Level-0 begins to Pass from 13th Program Loop

After Write / Erase

| Prog Loop | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 | 38 | 39 | 40 |
|---|---|---|---|---|---|---|---|---|---|---|---|---|---|---|---|---|---|---|---|---|---|---|---|---|---|---|---|---|---|---|---|---|---|---|---|---|---|---|---|---|---|
| Lev00 | | | | | v | v | v | v | v | x | x | x | x | x | o | o | o | o | o | o | o | o | o | | | | | | | | | | | | | | | | | | |
| Lev01 | | | | | | v | v | v | v | v | x | x | x | x | x | o | o | o | o | o | o | o | o | o | | | | | | | | | | | | | | | | | |
| Lev02 | | | | | | | v | v | v | v | v | x | x | x | x | x | o | o | o | o | o | o | o | o | o | | | | | | | | | | | | | | | | |
| Lev03 | | | | | | | | v | v | v | v | v | x | x | x | x | x | o | o | o | o | o | o | o | o | o | | | | | | | | | | | | | | | |
| Lev04 | | | | | | | | | v | v | v | v | v | x | x | x | x | x | o | o | o | o | o | o | o | o | o | | | | | | | | | | | | | | |
| Lev05 | | | | | | | | | | v | v | v | v | v | x | x | x | x | x | o | o | o | o | o | o | o | o | o | | | | | | | | | | | | | |
| Lev06 | | | | | | | | | | | v | v | v | v | v | x | x | x | x | x | o | o | o | o | o | o | o | o | o | | | | | | | | | | | | |
| Lev07 | | | | | | | | | | | | v | v | v | v | v | x | x | x | x | x | o | o | o | o | o | o | o | o | o | | | | | | | | | | | |
| Lev08 | | | | | | | | | | | | | v | v | v | v | v | x | x | x | x | x | o | o | o | o | o | o | o | o | o | | | | | | | | | | |
| Lev09 | | | | | | | | | | | | | | v | v | v | v | v | x | x | x | x | x | o | o | o | o | o | o | o | o | o | | | | | | | | | |
| Lev10 | | | | | | | | | | | | | | | v | v | v | v | v | x | x | x | x | x | o | o | o | o | o | o | o | o | o | | | | | | | | |
| Lev11 | | | | | | | | | | | | | | | | v | v | v | v | v | x | x | x | x | x | o | o | o | o | o | o | o | o | o | | | | | | | |
| Lev12 | | | | | | | | | | | | | | | | | v | v | v | v | v | x | x | x | x | x | o | o | o | o | o | o | o | o | o | | | | | | |
| Lev13 | | | | | | | | | | | | | | | | | | v | v | v | v | v | x | x | x | x | x | o | o | o | o | o | o | o | o | o | | | | | |
| Lev14 | | | | | | | | | | | | | | | | | | | v | v | v | v | v | x | x | x | x | x | o | o | o | o | o | o | o | o | o | | | | |
| Lev15 | | | | | | | | | | | | | | | | | | | | v | v | v | v | v | x | x | x | x | x | o | o | o | o | o | o | o | o | o | | | |

Data write becomes earlier by W / E, and Verify at Level-0 begins to Pass from 9th Program Loop

Verify Skip — Number of times of Verify: 304

| Prog Loop | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 | 38 | 39 | 40 |
|---|---|---|---|---|---|---|---|---|---|---|---|---|---|---|---|---|---|---|---|---|---|---|---|---|---|---|---|---|---|---|---|---|---|---|---|---|---|---|---|---|---|
| Lev00 | | | | | v | v | v | v | v | v | v | v | v | v | v | v | v | v | v | v | v | | | | | | | | | | | | | | | | | | | | |
| Lev01 | | | | | | v | v | v | v | v | v | v | v | v | v | v | v | v | v | v | v | v | | | | | | | | | | | | | | | | | | | |
| Lev02 | | | | | | | v | v | v | v | v | v | v | v | v | v | v | v | v | v | v | v | v | | | | | | | | | | | | | | | | | | |
| Lev03 | | | | | | | | v | v | v | v | v | v | v | v | v | v | v | v | v | v | v | v | v | | | | | | | | | | | | | | | | | |
| Lev04 | | | | | | | | | v | v | v | v | v | v | v | v | v | v | v | v | v | v | v | v | v | | | | | | | | | | | | | | | | |
| Lev05 | | | | | | | | | | v | v | v | v | v | v | v | v | v | v | v | v | v | v | v | v | v | | | | | | | | | | | | | | | |
| Lev06 | | | | | | | | | | | v | v | v | v | v | v | v | v | v | v | v | v | v | v | v | v | v | | | | | | | | | | | | | | |
| Lev07 | | | | | | | | | | | | v | v | v | v | v | v | v | v | v | v | v | v | v | v | v | v | v | | | | | | | | | | | | | |
| Lev08 | | | | | | | | | | | | | v | v | v | v | v | v | v | v | v | v | v | v | v | v | v | v | v | | | | | | | | | | | | |
| Lev09 | | | | | | | | | | | | | | v | v | v | v | v | v | v | v | v | v | v | v | v | v | v | v | v | | | | | | | | | | | |
| Lev10 | | | | | | | | | | | | | | | v | v | v | v | v | v | v | v | v | v | v | v | v | v | v | v | v | | | | | | | | | | |
| Lev11 | | | | | | | | | | | | | | | | v | v | v | v | v | v | v | v | v | v | v | v | v | v | v | v | v | | | | | | | | | |
| Lev12 | | | | | | | | | | | | | | | | | v | v | v | v | v | v | v | v | v | v | v | v | v | v | v | v | v | | | | | | | | |
| Lev13 | | | | | | | | | | | | | | | | | | v | v | v | v | v | v | v | v | v | v | v | v | v | v | v | v | v | | | | | | | |
| Lev14 | | | | | | | | | | | | | | | | | | | v | v | v | v | v | v | v | v | v | v | v | v | v | v | v | v | v | | | | | | |
| Lev15 | | | | | | | | | | | | | | | | | | | | v | v | v | v | v | v | v | v | v | v | v | v | v | v | v | v | v | | | | |

{ Considering that data write becomes earlier by W / E, the "loop number at which Verify is started" needs to be set at low value }

Data write flow (modified Verify Skip : Modification 2)

FIG. 18

Modified Verify Skip — Number of times of Verify: 107

| Prog Loop | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 | 38 | 39 | 40 |
|---|---|---|---|---|---|---|---|---|---|---|---|---|---|---|---|---|---|---|---|---|---|---|---|---|---|---|---|---|---|---|---|---|---|---|---|---|---|---|---|---|---|
| Lev00 | v | v | v | v | v | v | v | v | v | v | v | x | x | x | x | x | o | | | | | | | | | | | | | | | | | | | | | | | | |
| Lev01 | | | v | v | v | v | v | v | v | v | x | x | x | x | x | x | o | | | | | | | | | | | | | | | | | | | | | | | | |
| Lev02 | | | | | | | | | | | | x | x | x | x | x | x | o | | | | | | | | | | | | | | | | | | | | | | | |
| Lev03 | | | | | | | | | | | | | x | x | x | x | x | x | o | | | | | | | | | | | | | | | | | | | | | | |
| Lev04 | | | | | | | | | | | | | | x | x | x | x | x | x | o | | | | | | | | | | | | | | | | | | | | | |
| Lev05 | | | | | | | | | | | | | | | | x | x | x | x | x | o | | | | | | | | | | | | | | | | | | | | |
| Lev06 | | | | | | | | | | | | | | | | | x | x | x | x | x | o | | | | | | | | | | | | | | | | | | | |
| Lev07 | | | | | | | | | | | | | | | | | | x | x | x | x | x | o | | | | | | | | | | | | | | | | | | |
| Lev08 | | | | | | | | | | | | | | | | | | | x | x | x | x | x | o | | | | | | | | | | | | | | | | | |
| Lev09 | | | | | | | | | | | | | | | | | | | | x | x | x | x | x | o | | | | | | | | | | | | | | | | |
| Lev10 | | | | | | | | | | | | | | | | | | | | | x | x | x | x | x | o | | | | | | | | | | | | | | | |
| Lev11 | | | | | | | | | | | | | | | | | | | | | | x | x | x | x | x | o | | | | | | | | | | | | | | |
| Lev12 | | | | | | | | | | | | | | | | | | | | | | | x | x | x | x | x | o | | | | | | | | | | | | | |
| Lev13 | | | | | | | | | | | | | | | | | | | | | | | | x | x | x | x | x | o | | | | | | | | | | | | |
| Lev14 | | | | | | | | | | | | | | | | | | | | | | | | | x | x | x | x | x | o | | | | | | | | | | | |
| Lev15 | | | | | | | | | | | | | | | | | | | | | | | | | | x | x | x | x | x | o | | | | | | | | | | |

Arrows indicate Prog Loop columns 17, 18, 19.

FIG. 19

Modified Verify Skip (Initial) — Number of times of Verify: 109

| Prog Loop | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 | 38 | 39 | 40 |
|---|---|---|---|---|---|---|---|---|---|---|---|---|---|---|---|---|---|---|---|---|---|---|---|---|---|---|---|---|---|---|---|---|---|---|---|---|---|---|---|---|---|
| Lev00 | v | v | v | v | v | v | v | v | v | v | v | v | x | x | x | x | x | x | o |   |   |   |   |   |   |   |   |   |   |   |   |   |   |   |   |   |   |   |   |   |   |
| Lev01 |   |   |   |   |   |   |   |   |   |   |   |   |   |   | x | x | x | x | x | o |   |   |   |   |   |   |   |   |   |   |   |   |   |   |   |   |   |   |   |   |   |
| Lev02 |   |   |   |   |   |   |   |   |   |   |   |   |   |   |   | x | x | x | x | x | o |   |   |   |   |   |   |   |   |   |   |   |   |   |   |   |   |   |   |   |   |
| Lev03 |   |   |   |   |   |   |   |   |   |   |   |   |   |   |   |   | x | x | x | x | x | o |   |   |   |   |   |   |   |   |   |   |   |   |   |   |   |   |   |   |   |
| Lev04 |   |   |   |   |   |   |   |   |   |   |   |   |   |   |   |   |   | x | x | x | x | x | o |   |   |   |   |   |   |   |   |   |   |   |   |   |   |   |   |   |   |
| Lev05 |   |   |   |   |   |   |   |   |   |   |   |   |   |   |   |   |   |   | x | x | x | x | x | o |   |   |   |   |   |   |   |   |   |   |   |   |   |   |   |   |   |
| Lev06 |   |   |   |   |   |   |   |   |   |   |   |   |   |   |   |   |   |   |   | x | x | x | x | x | o |   |   |   |   |   |   |   |   |   |   |   |   |   |   |   |   |
| Lev07 |   |   |   |   |   |   |   |   |   |   |   |   |   |   |   |   |   |   |   |   | x | x | x | x | x | o |   |   |   |   |   |   |   |   |   |   |   |   |   |   |   |
| Lev08 |   |   |   |   |   |   |   |   |   |   |   |   |   |   |   |   |   |   |   |   |   | x | x | x | x | x | o |   |   |   |   |   |   |   |   |   |   |   |   |   |   |
| Lev09 |   |   |   |   |   |   |   |   |   |   |   |   |   |   |   |   |   |   |   |   |   |   | x | x | x | x | x | o |   |   |   |   |   |   |   |   |   |   |   |   |   |
| Lev10 |   |   |   |   |   |   |   |   |   |   |   |   |   |   |   |   |   |   |   |   |   |   |   | x | x | x | x | x | o |   |   |   |   |   |   |   |   |   |   |   |   |
| Lev11 |   |   |   |   |   |   |   |   |   |   |   |   |   |   |   |   |   |   |   |   |   |   |   |   | x | x | x | x | x | o |   |   |   |   |   |   |   |   |   |   |   |
| Lev12 |   |   |   |   |   |   |   |   |   |   |   |   |   |   |   |   |   |   |   |   |   |   |   |   |   | x | x | x | x | x | o |   |   |   |   |   |   |   |   |   |   |
| Lev13 |   |   |   |   |   |   |   |   |   |   |   |   |   |   |   |   |   |   |   |   |   |   |   |   |   |   | x | x | x | x | x | o |   |   |   |   |   |   |   |   |   |
| Lev14 |   |   |   |   |   |   |   |   |   |   |   |   |   |   |   |   |   |   |   |   |   |   |   |   |   |   |   | x | x | x | x | x | o |   |   |   |   |   |   |   |   |
| Lev15 |   |   |   |   |   |   |   |   |   |   |   |   |   |   |   |   |   |   |   |   |   |   |   |   |   |   |   |   | x | x | x | x | x | o |   |   |   |   |   |   |   |

Modified Verify Skip (After W/E)      Number of times of Verify: 105

| Prog Loop | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 | 36 | 37 | 38 | 39 | 40 |
|---|---|---|---|---|---|---|---|---|---|---|---|---|---|---|---|---|---|---|---|---|---|---|---|---|---|---|---|---|---|---|---|---|---|---|---|---|---|---|---|---|---|
| Lev00 | v | v | v | v | v | v | v | v | v | x | x | x | x | x | o |   |   |   |   |   |   |   |   |   |   |   |   |   |   |   |   |   |   |   |   |   |   |   |   |   |   |
| Lev01 |   |   |   |   |   |   |   |   |   |   | x | x | x | x | x | o |   |   |   |   |   |   |   |   |   |   |   |   |   |   |   |   |   |   |   |   |   |   |   |   |   |
| Lev02 |   |   |   |   |   |   |   |   |   |   |   | x | x | x | x | x | o |   |   |   |   |   |   |   |   |   |   |   |   |   |   |   |   |   |   |   |   |   |   |   |   |
| Lev03 |   |   |   |   |   |   |   |   |   |   |   |   | x | x | x | x | x | o |   |   |   |   |   |   |   |   |   |   |   |   |   |   |   |   |   |   |   |   |   |   |   |
| Lev04 |   |   |   |   |   |   |   |   |   |   |   |   |   | x | x | x | x | x | o |   |   |   |   |   |   |   |   |   |   |   |   |   |   |   |   |   |   |   |   |   |   |
| Lev05 |   |   |   |   |   |   |   |   |   |   |   |   |   |   | x | x | x | x | x | o |   |   |   |   |   |   |   |   |   |   |   |   |   |   |   |   |   |   |   |   |   |
| Lev06 |   |   |   |   |   |   |   |   |   |   |   |   |   |   |   | x | x | x | x | x | o |   |   |   |   |   |   |   |   |   |   |   |   |   |   |   |   |   |   |   |   |
| Lev07 |   |   |   |   |   |   |   |   |   |   |   |   |   |   |   |   | x | x | x | x | x | o |   |   |   |   |   |   |   |   |   |   |   |   |   |   |   |   |   |   |   |
| Lev08 |   |   |   |   |   |   |   |   |   |   |   |   |   |   |   |   |   | x | x | x | x | x | o |   |   |   |   |   |   |   |   |   |   |   |   |   |   |   |   |   |   |
| Lev09 |   |   |   |   |   |   |   |   |   |   |   |   |   |   |   |   |   |   | x | x | x | x | x | o |   |   |   |   |   |   |   |   |   |   |   |   |   |   |   |   |   |
| Lev10 |   |   |   |   |   |   |   |   |   |   |   |   |   |   |   |   |   |   |   | x | x | x | x | x | o |   |   |   |   |   |   |   |   |   |   |   |   |   |   |   |   |
| Lev11 |   |   |   |   |   |   |   |   |   |   |   |   |   |   |   |   |   |   |   |   | x | x | x | x | x | o |   |   |   |   |   |   |   |   |   |   |   |   |   |   |   |
| Lev12 |   |   |   |   |   |   |   |   |   |   |   |   |   |   |   |   |   |   |   |   |   | x | x | x | x | x | o |   |   |   |   |   |   |   |   |   |   |   |   |   |   |
| Lev13 |   |   |   |   |   |   |   |   |   |   |   |   |   |   |   |   |   |   |   |   |   |   | x | x | x | x | x | o |   |   |   |   |   |   |   |   |   |   |   |   |   |
| Lev14 |   |   |   |   |   |   |   |   |   |   |   |   |   |   |   |   |   |   |   |   |   |   |   | x | x | x | x | x | o |   |   |   |   |   |   |   |   |   |   |   |   |
| Lev15 |   |   |   |   |   |   |   |   |   |   |   |   |   |   |   |   |   |   |   |   |   |   |   |   | x | x | x | x | x | o |   |   |   |   |   |   |   |   |   |   |   |

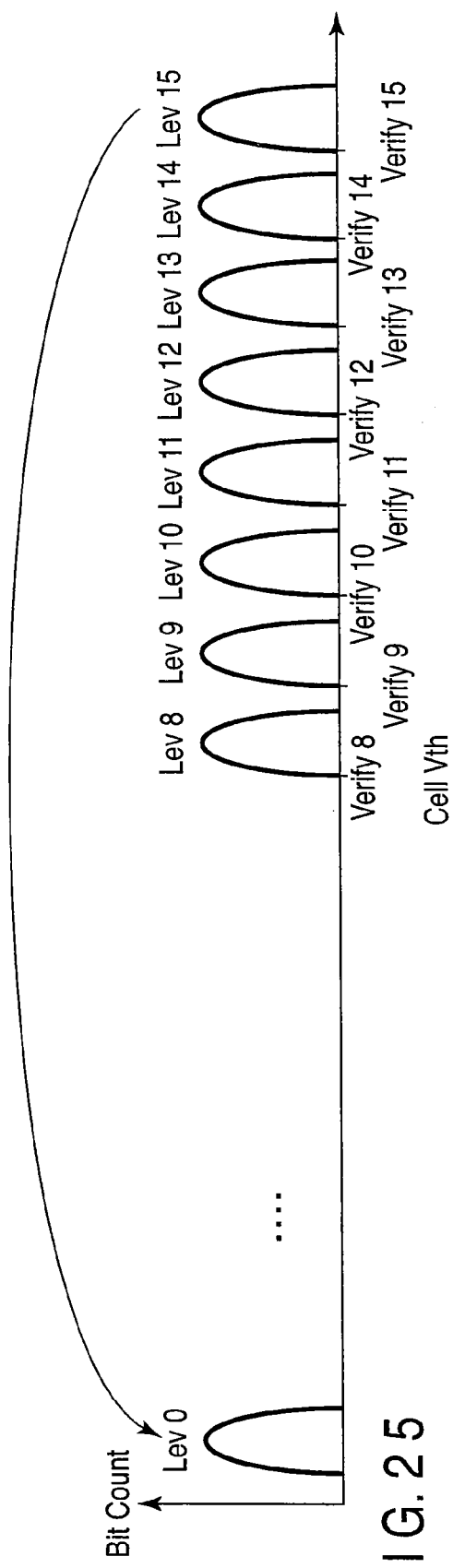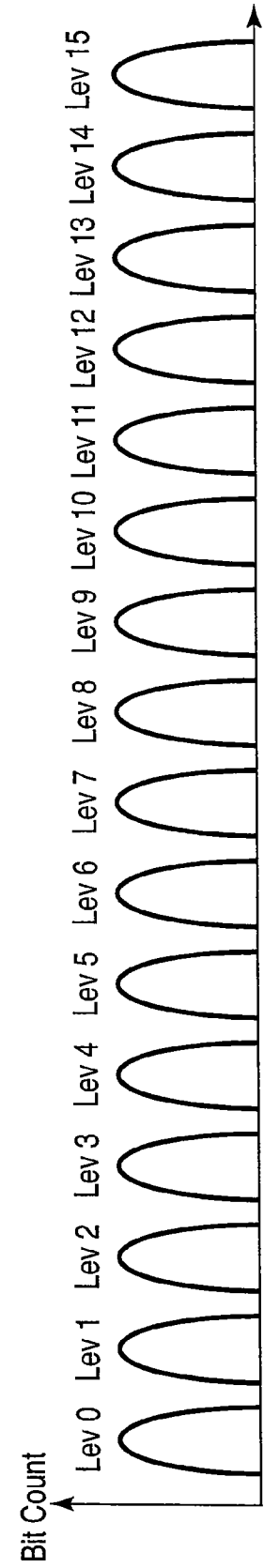
F I G. 25 Threshold value distribution (second embodiment): Prog Loop 34
F I G. 26 Threshold value distribution (second embodiment): Prog Loop 67

SEMICONDUCTOR MEMORY DEVICE AND DATA WRITE METHOD THEREOF

CROSS-REFERENCE TO RELATED APPLICATIONS

This application is a continuation of and claims the benefit of priority under 35 U.S.C. §120 from U.S. Ser. No. 13/099,962 filed May 3, 2011, which is a continuation of U.S. Ser. No. 12/535,040 filed Aug. 4, 2009, and claims the benefit of priority under 35 U.S.C. §119 from Japanese Patent Application No. 2008-230295 filed Sep. 8, 2008, the entire contents of each of which are incorporated herein by reference.

BACKGROUND OF THE INVENTION

1. Field of the Invention

The present invention relates to a semiconductor memory device and a data write method thereof, and is applied, for example, to a NAND flash memory.

2. Description of the Related Art

In a data write operation of a NAND flash memory, for example, a program loop is repeated with an arbitrary step width, and the program loop is stopped when data write in all bits is finished.

With the development of multilevel implementation of NAND flash memories, it becomes necessary to more finely control the intervals of data write levels of memory cells. It is thus necessary to make a write step voltage (dVPGM) lower. However, the decrease in write step voltage (dVPGM) leads to an increase in the number of times of data write, that is, an increase in program time (tPROG).

In the market in recent years, there has been a stronger demand for higher-speed, larger-capacity memories. In this trend, one problem is how to shorten a write time, while ensuring reliability.

BRIEF SUMMARY OF THE INVENTION

According to an aspect of the present invention, there is provided a semiconductor memory device comprising: a memory cell array including a plurality of memory cells which are arranged in a matrix at intersections between a plurality of word lines and a plurality of bit lines; a word line driving circuit which applies a voltage to the word lines; a bit line control circuit including a buffer which retains a verify result of the memory cell array, and a bit scan circuit which counts a verify pass bit number on the basis of the verify result that is retained in the buffer; and a control circuit which controls the word line driving circuit and the bit line control circuit, the control circuit executing control to perform a verify operation with respect to only a lowest threshold voltage level of the memory cell at a time of a data write operation, and to skip the verify operation with respect to the other threshold voltage levels.

According to another aspect of the present invention, there is provided a semiconductor memory device comprising: a memory cell array including a plurality of memory cells which are arranged in a matrix at intersections between a plurality of word lines and a plurality of bit lines, and are capable of storing multi-bit data; a word line driving circuit which applies a voltage to the word lines; a bit line control circuit including a buffer which retains a verify result of the memory cell array, and a bit scan circuit which counts a verify pass bit number on the basis of the verify result that is retained in the buffer; and a control circuit which controls the word line driving circuit and the bit line control circuit, the control circuit executing control to perform a verify operation with respect to only a first threshold voltage level which is higher than a lowest threshold voltage level of the memory cell at a time of a data write operation, and to skip the verify operation with respect to the other threshold voltage levels.

According to still another aspect of the present invention, there is provided a data write method of a semiconductor memory device, comprising: executing a verify operation with respect to only a lowest threshold voltage level of a memory cell, and skipping the verify operation with respect to the other threshold voltage levels; counting a verify pass bit number of the lowest threshold voltage level; determining whether the counted verify pass bit number of the lowest threshold voltage level is a prescribed bit number or more; and executing, if the verify pass bit number is the prescribed bit number or more, the verify operation with respect to only the lowest threshold voltage level and a threshold voltage level that is higher than the lowest threshold voltage level, and skipping the verify operation with respect to the other threshold voltage levels.

BRIEF DESCRIPTION OF THE SEVERAL VIEWS OF THE DRAWING

FIG. 2 is a block diagram showing a structure example of a bit line control circuit in FIG. 1;

FIG. 3 is an equivalent circuit diagram showing a structure example of a block in FIG. 1;

FIG. 14 is a view showing the relationship between the write loop and the number of times of verify in a case of "Initial";

FIG. 15 is a view showing the relationship between the write loop and the number of times of verify in a case of "After Write/Erase";

FIG. 16 is a view showing the relationship between the write loop and the number of times of verify in a final state of verify skip;

FIG. 18 is a view showing the relationship between the write loop and the number of times of verify in a final state of improved verify skip;

FIG. 19 is a view showing the relationship between the write loop and the number of times of verify in the "Initial" state of improved verify skip;

FIG. 20 is a view showing the relationship between the write loop and the number of times of verify in the case of "After Write/Erase" of improved verify skip;

FIG. 22 is a view showing the relationship between the write loop and the number of times of verify in a semiconductor memory device according to a second embodiment of the invention;

FIG. 25 is a view showing a threshold value distribution in one write loop of the semiconductor memory device according to the second embodiment; and FIG. 26 is a view showing a threshold value distribution in one write loop of the semiconductor memory device according to the second embodiment.

DETAILED DESCRIPTION OF THE INVENTION

Figure 1:
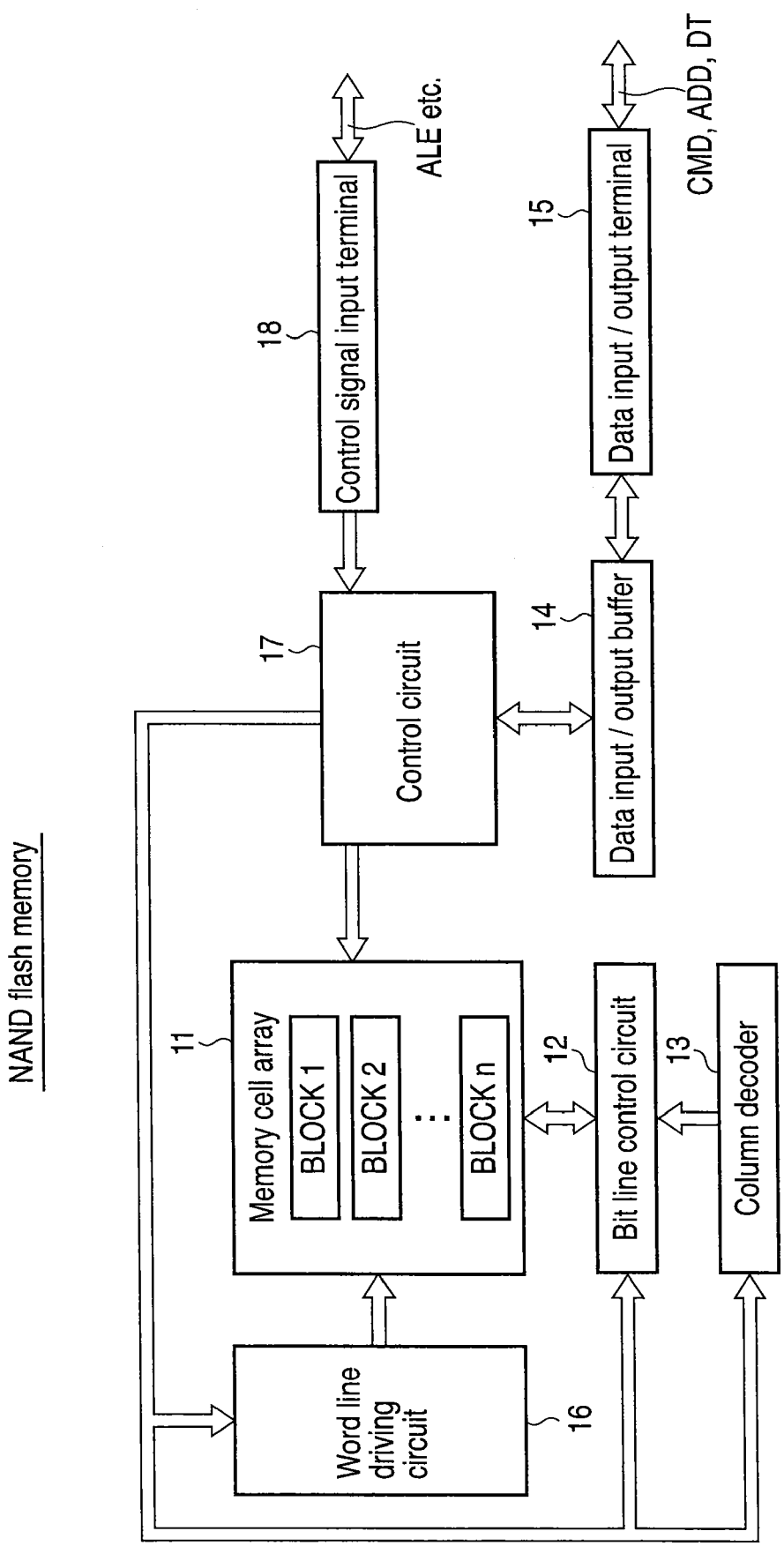
FIG. 1 is a block diagram showing an example of the entire structure of a semiconductor memory device according to a first embodiment of the present invention.

Embodiments of the present invention will now be described with reference to the accompanying drawings. In the description below, common parts are denoted by like reference numerals throughout the drawings. In addition, in the description of the embodiments, NAND flash memories are taken as examples of semiconductor memory devices.

Data write of a select word line of a NAND flash memory is the repetition of application of write pulses (Program) and verify pulses (Verify) (see, e.g. Jpn. Pat. Appln. KOKAI Publication No. 2002-140899).

Further, in a multilevel NAND flash memory (MLC: multilevel cell), the time of application of verify pulses (Verify) occupies most of the write time. Thus, from the standpoint of reduction in data write time, it is important to reduce the number of times of application of verify pulses (Verify) as much as possible, while maintaining reliability.

However, in the above-described data write operation with the general structure, the application of verify pulses is executed at all threshold voltage levels, and this is disadvantageous in reduction of program time (tPROG).

Thus, semiconductor memory devices and the data write methods thereof, which are advantageous in reducing the program time (tPROG), are concretely described with reference to the following embodiments.

FIRST EMBODIMENT

1. Structure Example

To begin with, referring to FIG. 1 to FIG. 6, a description is given of a structure example of the NAND flash memory according to the first embodiment of the present invention.

1-1. Example of Entire Structure

FIG. 1 shows an example of the entire structure of the NAND flash memory according to the first embodiment.

As shown in FIG. 1, the NAND flash memory according to this embodiment comprises a memory cell array 11, a bit line control circuit 12, a column decoder 13, a data input/output buffer 14, a data input/output terminal 15, a word line driving circuit 16, a control circuit 17, and a control signal input terminal 18.

The memory cell array 11 is composed of a plurality of blocks (BLOCK1 to BLOCKn). The word line driving circuit 16 for controlling word lines and the bit line control circuit 12 for controlling bit lines are connected to the memory cell array 11.

The bit line control circuit 12 reads data of memory cell transistors in the memory cell array 11 via the bit lines, and detects the states of the memory cell transistors in the memory cell array 11 via the bit lines. In addition, the bit line control circuit 12 executes data write in the memory cell transistors by applying write control voltages to the memory cell transistors in the memory cell array 11 via the bit lines. The column decoder 13 and the data input/output buffer 14 are connected to the bit line control circuit 12.

Data memory circuits (not shown) are provided in the bit line control circuit 12, and the data memory circuits are selected by the column decoder 13. The data of the memory cell transistors, which are read into the data memory circuits, are output to the outside from the data input/output terminal 15 via the data input/output buffer 14. The data input/output terminal 15 is connected to, for example, an external host device (or memory controller).

The host device is, for instance, a microcomputer, which receives data that is output from the data input/output terminal 15. Further, the host device outputs various commands CMD which control the operation of the NAND flash memory, addresses ADD and data DT. Write data, which is input to the data input/output terminal 15 from the host device, is delivered via the data input/output buffer 14 to the data memory circuits (not shown) which are selected by the column decoder 13. On the other hand, the commands and addresses are delivered to the control circuit 17.

The word line driving circuit 16 selects the word lines in the memory cell array 11, and applies voltages necessary for data read, write or erase to the selected word lines.

The control circuit 17 delivers necessary control signals and control voltages to the respective circuits that are connected. The control circuit 17 is connected to the memory cell array 11, bit line control circuit 12, column decoder 13, data input/output buffer 14 and word line driving circuit 16. These connected structural circuits are controlled by the control circuit 17. The control circuit 17 is connected to the control signal input terminal 18, and is controlled by control signals, such as an ALE (address latch enable) signal, which are input from the external host device (or memory controller) via the control signal input terminal 18. In addition, the control circuit 17 includes an internal voltage generating circuit, and supplies control voltages which are necessary for the operations of the connected structural circuits.

The word line driving circuit 16, bit line control circuit 12, column decoder 13 and control circuit 17 constitute a write circuit, a read circuit and an erase circuit.

1-2. Structure Example of the Bit Line Control Circuit

Next, referring to FIG. 2, a description is given of a structure example of the bit line control circuit 12 according to the first embodiment.

As shown in FIG. 2, the bit line control circuit 12 according to this embodiment includes a page buffer 21, a bit scan circuit 22 and a cache memory 23.

The page buffer 21 retains, for example, a verify result at a time of a data write operation, which will be described later.

The bit scan circuit 22 counts a verify pass bit number on the basis of the verify result that is retained in the page buffer 21. To be more specific, at the time of the data write operation, the bit scan circuit 22 scans the data stored in the page buffer 21, which corresponds to page data.

At the time the verify operation, with respect to the data in the page buffer 21, which corresponds to the memory cell transistors in which data write is completed, inversion from "0" data to "1" data is executed in order to prevent further write. The data write operation is executed until all data that are retained in the page buffer 21 become "1" data.

The bit scan circuit 22 can scan not only the above-described bits (verify pass bits) for which data write is completed, but also bits (fail bits) for which data write is not completed. To be more specific, fail bits can be detected by executing detection in a manner reverse to the general detection in the bit scan circuit 22, for example, by altering the bit scan method in a manner to execute, e.g. binary scan.

The cache memory 23 is connected to the column decoder 13, and temporarily stores write/read data which is input from the column decoder 13.

The page buffer 21 and the cache memory 23 constitute a sense amplifier 25.

1-3. Structure Example of Block (BLOCK)

Next, a structure example of the blocks (BLOCK), which constitute the memory cell array according to the first embodiment, is described with reference to FIG. 3. In this description, one block (BLOCK1) in FIG. 1 is taken as an example. The memory cell transistors in the block BLOCK1 are erased batchwise. Thus, the block is an erase unit.

The block BLOCK1 is composed of a plurality of memory cell units MU which are arranged in the word line direction (WL direction). The memory cell unit MU comprises a NAND string (memory cell string), which is composed of eight memory cell transistors MT0 to MT7 that are arranged in the bit line direction (BL direction) perpendicular to the WL direction and have series-connected current paths, a source-side select transistor S1 which is connected to one end of the current path of the NAND string, and a drain-side select transistor S2 which is connected to the other end of the current path of the NAND string.

In this example, the memory cell unit MU is composed of eight memory cells MT0 to MT7. However, the memory cell unit MU may be composed of two or more memory cells, for instance, 16 memory cells or 32 memory cells, and the number of memory cells is not limited to eight.

The other end of the current path of the source-side select transistor S1 is connected to a source line SL. The other end of the current path of the drain-side select transistor S2 is connected to a bit line BLm-1, which is provided on the upper side of the memory cell unit MU in association with each memory cell unit MU, and extends in the BL direction.

Word lines WL0 to WL7 extend in the WL direction, and are commonly connected to control gate electrodes of a plurality of memory cell transistors which are arranged in the WL direction. A select gate line SGS extends in the WL direction, and is commonly connected to a plurality of select transistors S1 which are arranged in the WL direction. Similarly, a select gate line SGD extends in the WL direction, and is commonly connected to a plurality of select transistors S2 which are arranged in the WL direction.

A page (PAGE) is present in each of the word lines WL0 to WL7. For example, as indicated by a broken-line box in FIG. 3, a page (PAGE) is present in the word line WL7. Since a read operation and a write operation are executed in units of the page (PAGE), the page (PAGE) is a read unit and a write unit.

1-4-1. Plan-view Structure Example of the Memory Cell Array

Figure 4:
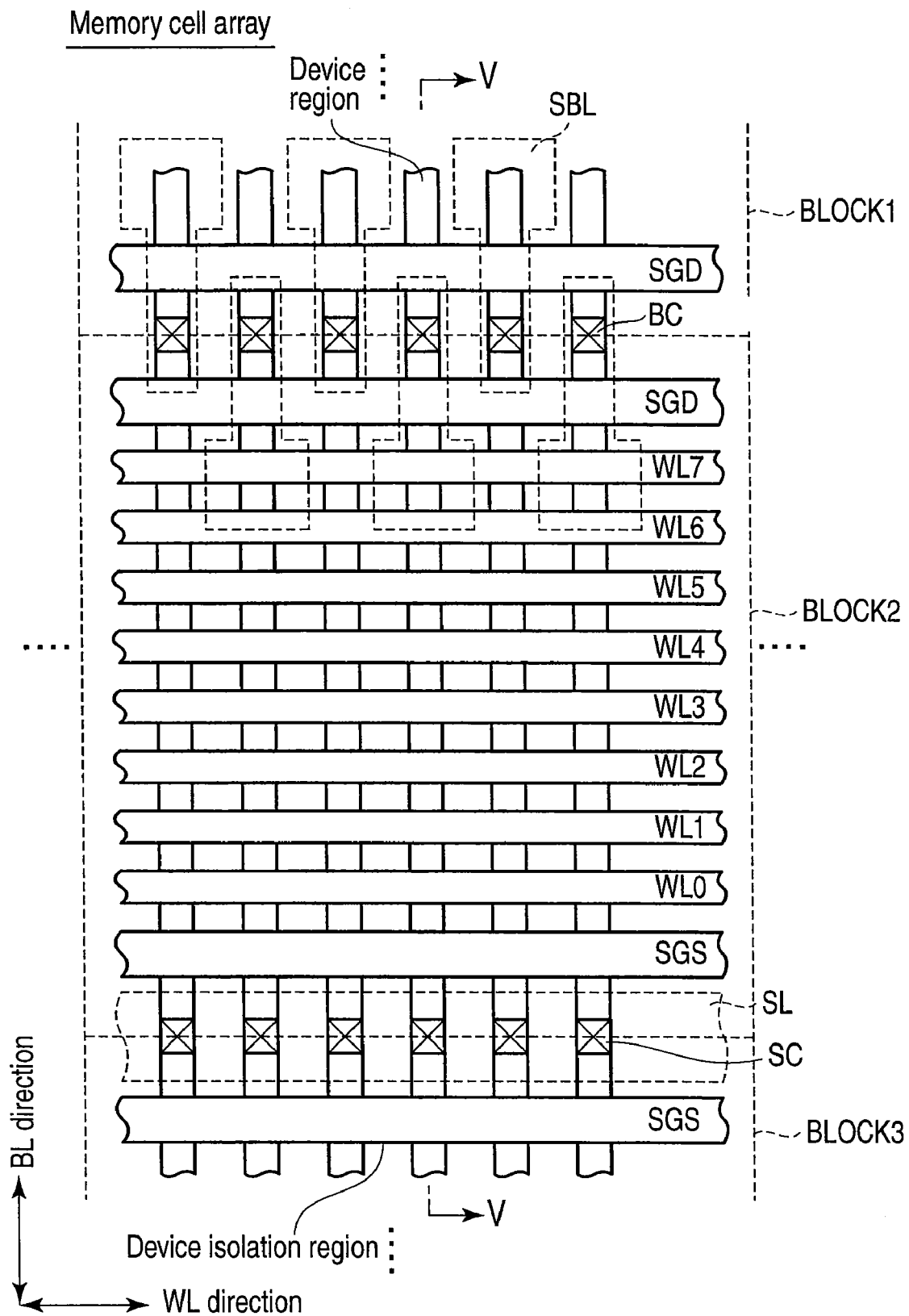
FIG. 4 is a plan view showing a plan-view structure example of a memory cell array in FIG. 1.

Next, referring to FIG. 4, a plan-view structure example of the memory cell array 11 is described. As shown in FIG. 4, each of the plural blocks (BLOCK1, BLOCK2, . . . ), which constitute the memory cell array 11, includes a plurality of memory cell transistors which are arranged in a matrix at intersections between the plural word lines WL0 to WL7 and device regions which are divided by device isolation regions and extend in the BL direction, and select transistors S1 and S2 which are arranged at intersections between the select gate lines SGS and SGD and the device regions. The device isolation region is formed by burying, e.g. a silicon oxide film in a surface portion of the semiconductor substrate.

Source line contacts SC and bit line contacts BC are formed on device regions on both sides of the memory cell unit which is composed of plural memory cell transistors and select transistors S1 and S2. The source line contacts SC and bit line contacts BC are shared by blocks neighboring in the BL direction. For example, the source line contacts SC are shared by the block BLOCK2 and block BLOCKS which neighbor in the BL direction, and the bit line contacts BC are shared by the block BLOCK1 and block BLOCK2 which neighbor in the BL direction.

The source line SL is provided on the source line contacts SC, and sub-bit lines SBL are provided on the bit line contacts BC. Inter-wiring contacts LC are provided on the sub-bit lines SBL, and the bit lines BL0 to BLm-1 are provided on the inter-wiring contacts LC.

1-4-2. Cross-Sectional Structure Example of the Memory Cell Array

Figure 5:
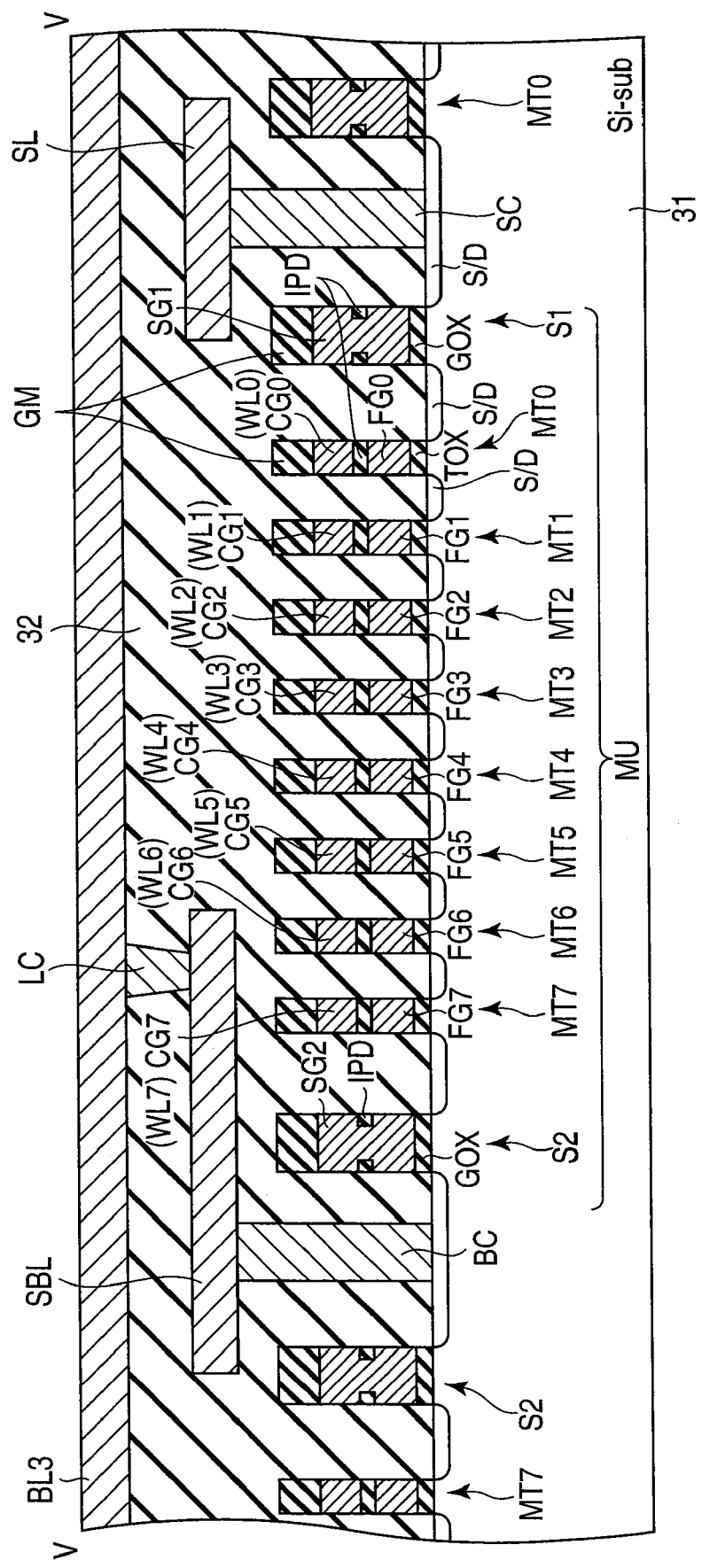
FIG. 5 is a cross-sectional view showing a structure example of a cross section taken along line V-V in FIG. 4.

Next, referring to FIG. 5, a description is given of a cross-sectional structure example of the memory cell array according to the first embodiment. In this description, a cross-sectional structure example in a direction of the bit line BL3 along line V-V in FIG. 4 is taken as an example.

As shown in FIG. 5, a memory cell unit MU is disposed on a device region of a semiconductor substrate (Si-sub) 31. The memory cell unit MU includes a plurality of memory cell transistors MT0 to MT7, which have neighboring current paths and are connected in series, and select transistors S1 and S2 which select the memory cell transistors MT0 to MT7.

Each of the memory cell transistors MT0 to MT7 has a multi-layer structure comprising a tunnel insulation film Tox, a floating electrode, FG0 to FG7, an inter-gate insulation film IPD, a control electrode, CG0 to CG7 (WL0 to WL7), and a gate mask layer GM, which are successively formed on the semiconductor substrate. Each of the memory cell transistors MT0 to MT7 has a source S and a drain D, which are provided, spaced apart, in the semiconductor substrate 31 in a manner to sandwich the multi-layer structure.

The select transistor S1 is disposed on the source side of the NAND string which is configured such that the current paths of the memory cell transistors MT0 to MT7 are connected in series. The select transistor S1 includes, in the named order on the semiconductor substrate 31, a gate insulation film Gox, a gate electrode SG1, a gate cap layer GM, an inter-gate insulation film IPD, which is split at its central part in the gate electrode SG1, with the upper and lower layers of the inter-gate insulation film IPD being electrically connected, and a source S and a drain D which are provided, spaced apart, in the semiconductor substrate 31 in a manner to sandwich the gate electrode SG1.

The select transistor S2 is disposed on the drain side of the NAND string. The select transistor S2 includes, in the named order on the semiconductor substrate 31, a gate insulation film Gox, a gate electrode SG2, a gate cap layer GM, an inter-gate insulation film IPD, which is split at its central part in the gate electrode SG2, with the upper and lower layers of the inter-gate insulation film IPD being electrically connected, and a source S and a drain D which are provided, spaced apart, in the semiconductor substrate 31 in a manner to sandwich the gate electrode SG2.

A source line contact SC is provided on the source S/drain D of the select transistor S1. A bit line contact BC is provided on the source S/drain D of the select transistor S2.

The source line contact SC, bit line contact BC, source line SL, sub-bit line SBL, inter-wiring contact LC and bit line BL3 are provided in an interlayer insulation film 32.

Although not shown, a P-well or an N-well may be provided in the semiconductor substrate 31. The P-well or N-well is formed by doping P-type impurities or N-type impurities in the semiconductor substrate 31.

The control gate electrodes CG0 to CG7 (or word lines WL0 to WL7) and the select gates SGS and SGD are electrically connected to the control circuit 17 via a row decoder which is disposed in the word line driving circuit 16. A transfer gate is provided in the row decoder. An address select signal line is provided on the gate electrode of the transfer gate. A voltage, which is generated in the control circuit 17, is applied to any one of the memory cell transistors MT0 to MT7, which has a selected address.

The description in this section 1-4-2 is given of the structure example in which the gate insulation film Gox and tunnel insulation film Tox are provided in association with each of the select transistor S1, S2 and the memory transistor, MT0 to MT7. The invention, however, is not limited to this structure example. For instance, such a structure may be adopted that the gate insulation film Gox and tunnel insulation film Tox may be disposed over the semiconductor substrate 31 and may be provided commonly to the select transistors S1 and S2 and the memory transistors MT0 to MT7.

1-5. Example of Threshold Value Distribution

Figure 6:
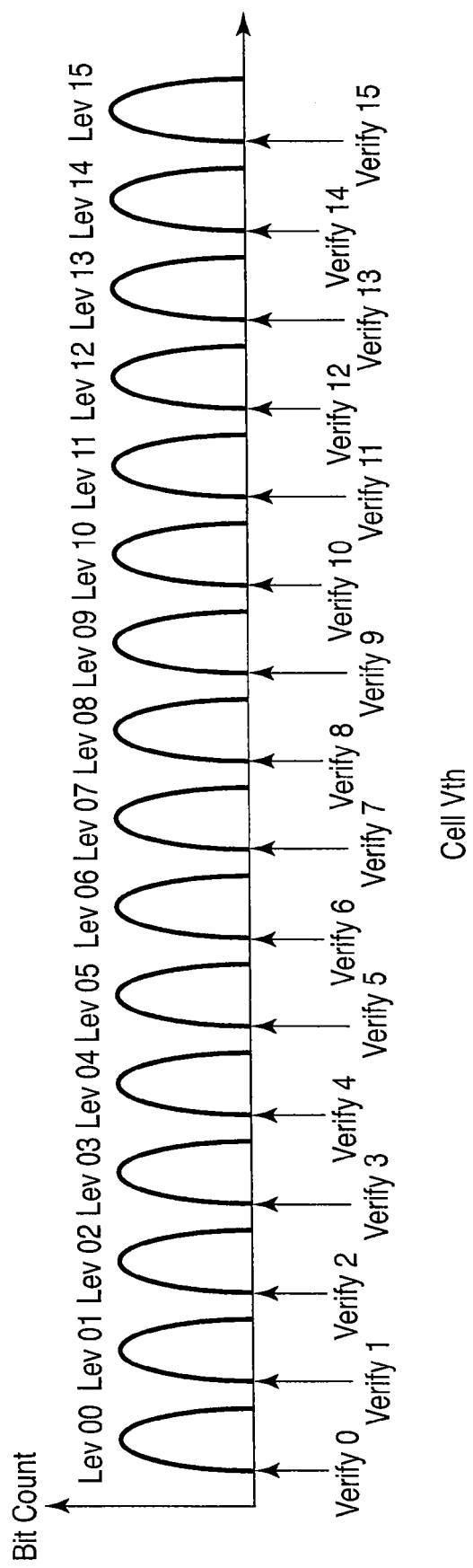
FIG. 6 is a view showing a threshold value distribution of the semiconductor memory device according to the first embodiment.

Next, referring to FIG. 6, a description is given of the distribution of threshold voltages of the NAND flash memory according to the first embodiment.

As shown in FIG. 6, the threshold voltage (Cell Vth) of the NAND flash memory according to this embodiment has a plurality of threshold voltage levels Lev00 to Lev15. Thus, the NAND flash memory according to the present embodiment is a multilevel NAND flash memory (MLC: multilevel cell) which can store a plurality of bits in one memory cell transistor MT. A 16-value multilevel NAND flash memory is described below by way of example.

2. Data Write Operation 2-1A. Data Write Operation (Verify Skip)

Next, referring to FIG. 7A to FIG. 11, a description is given of a data write operation (Verify Skip) of the nonvolatile semiconductor memory device according to the first embodiment. The description below is given with reference to a flow chart of FIG. 7A. The data write operation to be described below is a verify operation (hereinafter referred to as "Verify Skip") in which a verify operation relating to a predetermined threshold voltage level is omitted, as compared to a verify operation (hereinafter "Normal Verify") in which a verify operation is executed for all the threshold voltage levels.

(Step S1-1 (Program))

Figure 7A:
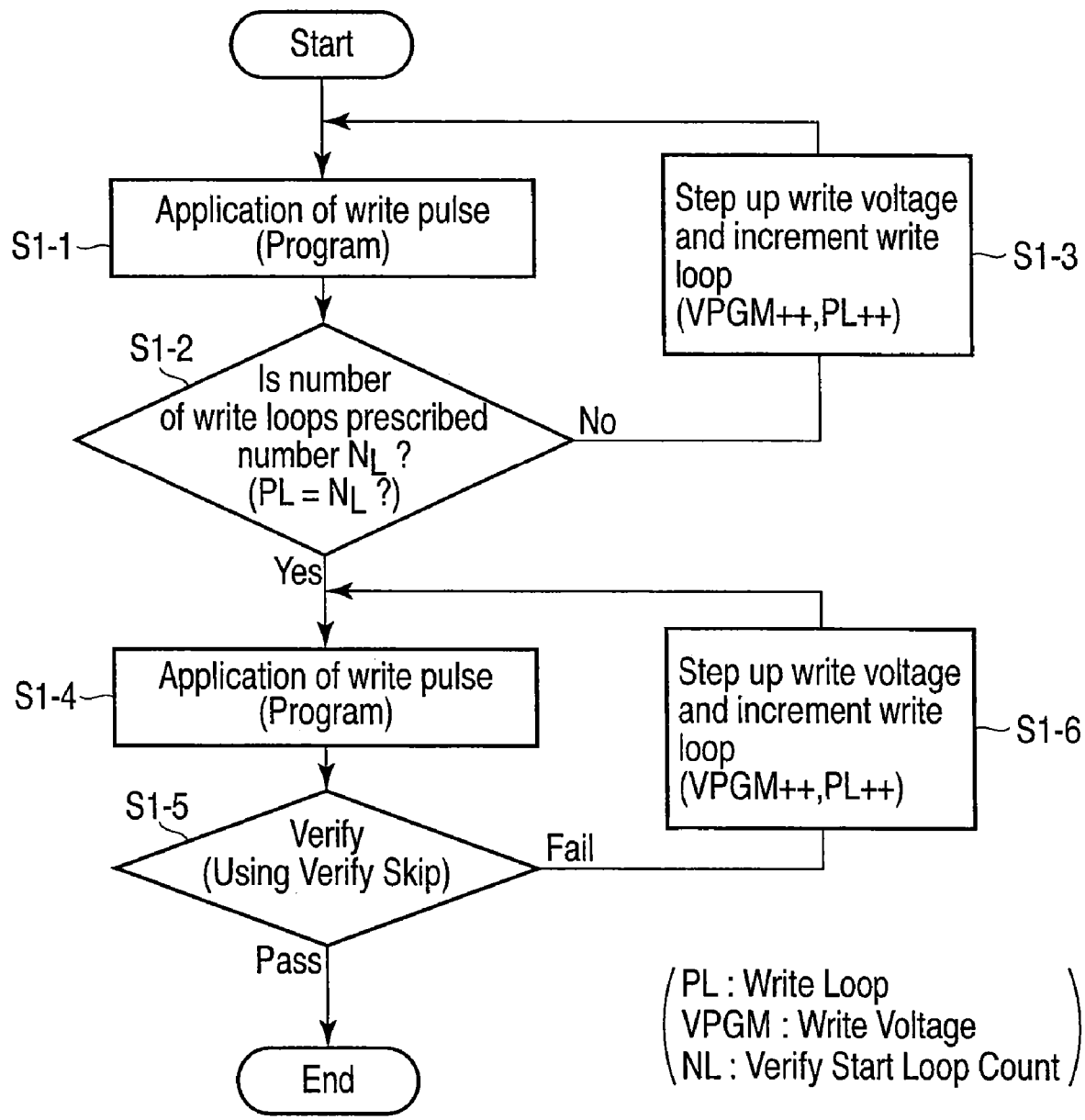
FIG. 7A is a flow chart illustrating data write of the semiconductor memory device according to the first embodiment.

To start with, as shown in FIG. 7A, the control circuit 17 executes control to apply a write pulse, on the basis of write data which is input from the external host device via the data input/output terminal 15.

(Step S1-2 (PL=$N_L$?))

Then, the control circuit 17 determines whether the number of times of application of write pulses (the number of write loops) PL is a prescribed number $N_L$ or not. The prescribed number $N_L$ is a value which is determined on the basis of a measurement result indicating that a bit at which data write is finished does not appear until the number of application of write pulses reaches the prescribed number $N_L$. Specifically, as long as the number of write loops is small, the verify operation is skipped with respect to all threshold levels.

(Step S1-3 (VPGM++, PL++))

In step S1-2, when the number of application of write pulses is not the prescribed number $N_L$ (No), the control circuit 17 steps up the write voltage VPGM, and increments the number of write loops by one, following which the above-described step S1-1 and step S102 are executed once again. To be more specific, to step up the write voltage VPGM means the write voltage VPGM=$VPGM_{init}$+dVPGM×$N_{Loop}$ ($VPGM_{init}$: an initial value, dVPGM: a step-up width, $N_{Loop}$: the number of loops).

(Step S1-4 (Program))

In step S1-2, if the number of application of write pulses, PL, is the prescribed number $N_L$ (Yes), the control circuit 17 applies write pulses on the basis of the write data that is input from the external host device via the data input/output terminal 15.

(Step S1-5 (Using Verify Skip))

Subsequently, the control circuit 17 controls the verify operation, and determines whether the verify operation can be completed or not. At this time, the verify operation (Verify Skip) is executed, in which a predetermined verify operation is skipped, compared to the very operation (Normal Verify) in which a verify operation is executed for all threshold voltages. This verify operation (Verify Skip) will be described later.

If the verify operation can be completed (Pass), the data write operation is finished.

(Step S1-6 (VPGM++, PL++))

If the verify operation cannot be completed (Fail), the write voltage VPGM is stepped up in the same manner as described above, and the number of write loops is incremented by one, following which the above-described steps S1-4 and S1-5 are executed once again.

2-1B. Data Write Operation (Verify Skip: Modification 1)

Figure 7B:
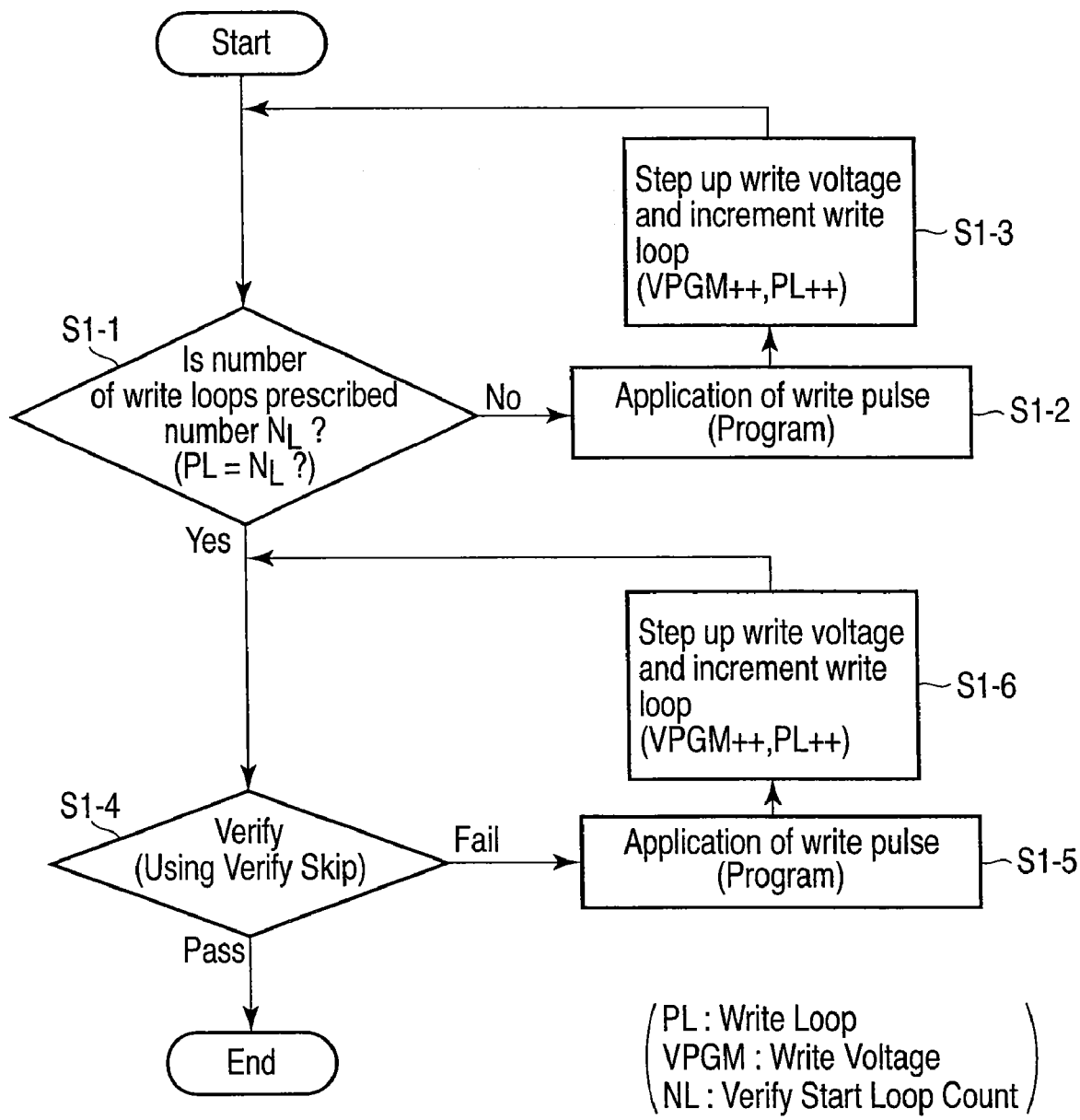
FIG. 7B is a flow chart illustrating data write of the semiconductor memory device according to the modification 1.

Next, referring to FIG. 7B, a description is given of a data write operation (Verify Skip) of the nonvolatile semiconductor memory device according to the modification 1. The description below is given with reference to a flow chart of FIG. 7B.

(Step S1-1 (PL=$N_L$?))

To start with, as shown in FIG. 7B, the control circuit 17 determines whether the number of times of application of write pulses (the number of write loops) PL is a prescribed number $N_L$ or not. The prescribed number $N_L$ is a value which is determined on the basis of a measurement result indicating that a bit at which data write is finished does not appear until the number of application of write pulses reaches the prescribed number $N_L$. Specifically, as long as the number of write loops is small, the verify operation is skipped with respect to all threshold levels.

(Step S1-2 (Program))

In step S1-1, when the number of application of write pulses PL, is not the prescribed number $N_L$ (No), the control circuit 17 executes control to apply a write pulse, on the basis of write data which is input from the external host device via the data input/output terminal 15.

(Step S1-3 (VPGM++, PL++))

Then, the control circuit 17 steps up the write voltage VPGM, and increments the number of write loops by one, following which the above-described step S1-1 and step S102 are executed once again. To be more specific, to step up the write voltage VPGM means the write voltage $VPGM=VPGM_{init}+dVPGM \times N_{Loop}$ ($VPGM_{init}$: an initial value, dVPGM: a step-up width, $N_{Loop}$: the number of loops).

(Step S1-4 (using Verify Skip))

In step S1-1, if the number of application of write pulses PL, is the prescribed number $N_L$ (Yes), the control circuit 17 controls the verify operation, and determines whether the verify operation can be completed or not. At this time, the verify operation (Verify Skip) is executed, in which a predetermined verify operation is skipped, compared to the very operation (Normal Verify) in which a verify operation is executed for all threshold voltages. This verify operation (Verify Skip) will be described later.

If the verify operation can be completed (Pass), the data write operation is finished (End).

(Step S1-5 (Program))

If the verify operation cannot be completed (Fail), the control circuit 17 applies write pulses on the basis of the write data that is input from the external host device via the data input/output terminal 15.

(Step S1-6 (VPGM++, PL++))

Then, write voltage VPGM is stepped up in the same manner as described above, and the number of write loops is incremented by one, following which the above-described step S1-4 is executed once again.

2-2. Verify Operation (Verify Skip)

Next, referring to FIG. 8 to FIG. 11, a description is given of the verify skip (Verify Skip) which is executed in the above-described FIG. 7A and FIG. 7B. In this description, comparison is made with the normal verify (Normal Verify) in which a verify operation is executed for all threshold voltage levels.

The Number of Times of the Verify Operation in the Case of the Verify Skip

Figure 8:
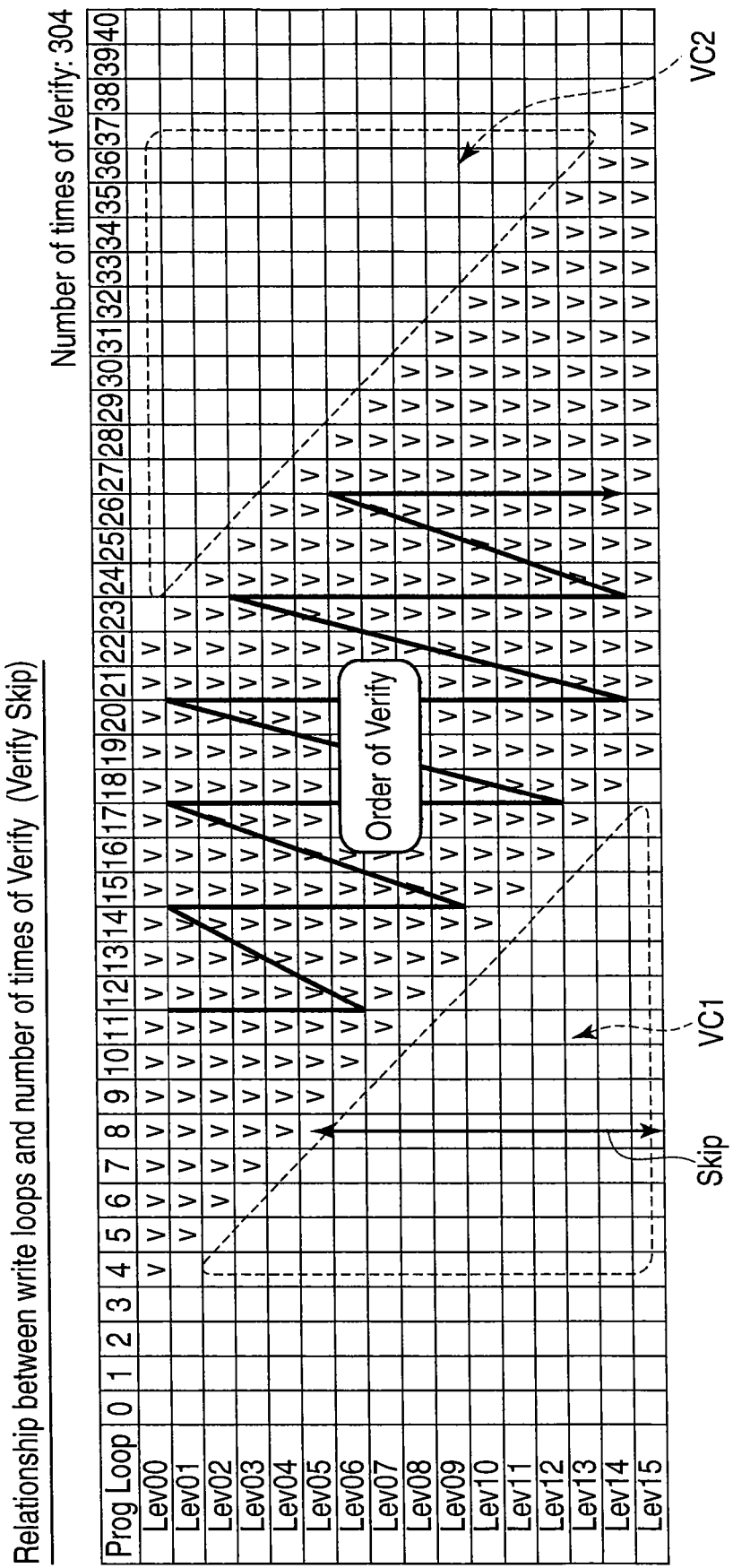
FIG. 8 is a view showing the relationship between write loops and the number of times of verify in a case of verify skip.

To begin with, referring to FIG. 8, a description is given of the number of verify operations in the case of the verify skip relating to the above-described step S1-5. The relationship between the write loops (Program Loop) and the threshold voltage level (Lev00 to lev15) in the case of the verify skip is as shown in FIG. 8.

As shown in FIG. 8, compared to the normal verify (Normal Verify) in which a verify operation is executed for all threshold voltage levels, Verify VC1 and Verify VC2, which are indicated by broken lines in FIG. 8, can be omitted ("Skip"). Thus, at the time of the data write operation, the program time can advantageously be shortened.

For example, in the case of the present example, under the supposition that the write at the threshold voltage level Lev00 will be finished from the fourth program loop (Prog Loop 4), a verify operation is executed for only the threshold voltage level Lev00 at the fourth program loop (the prescribed number $N_L$=3 is set). On the other hand, at the time of the fourth program loop (Prog Loop 4), the verify operation for the other threshold voltage levels Lev01 to Lev15 is not executed and is skipped.

For example, in the same manner as described above, at the time of the fifth program loop (Prog Loop 5), the verify operation is executed for only the threshold voltage levels Lev00 and Lev01. On the other hand, at the time of the fifth program loop (Prog Loop 5), the verify operation for the other threshold voltage levels Lev02 to Lev15 is not executed and is skipped.

For example, at the time of the eighth program loop (Prog Loop 8), which is indicated by an arrow in FIG. 8, the verify operation is executed for the threshold voltage levels Lev00 to Lev04. On the other hand, the verify operation for the other threshold voltage levels Lev05 to Lev15 is not executed and can be skipped.

Subsequently, in the same manner as described above, as the number of program loops increases, the threshold level for the verify operation is increased.

In the 23rd program loop (Prog Loop 23) and the following program loops, the verify operation is not executed for lower threshold voltage levels. For example, at the time of the 23rd program loop, the verify operation for the threshold voltage level Lev00 is not executed on the assumption that the write at the threshold voltage level Lev00 is already finished, and the verify operation for the threshold voltage levels Lev01 to Lev15 is executed.

Similarly, at the time of the 24th program loop (Prog Loop 24), the verify operation for the threshold voltage levels Lev01 and Lev02 is not executed on the assumption that the write at the threshold voltage levels Lev01 and Lev02 is already finished, and the verify operation for the threshold voltage levels Lev03 to Lev15 is executed.

Subsequently, in the same manner as described above, as the number of program loops increases, the threshold level for the verify operation is decreased.

The above-described verify operation can be realized, for example, by presetting the "write loop number at which the verify operation is started" and the "write loop number at which the very operation is finished" with respect to each of the threshold levels.

In this manner, since the write voltage is stepped up with fixed steps (dVPGM), the threshold level, which is the object of the verify operation, can be increased stepwise in the initial stage of data write (Prog Loop 4 to Prog Loop 19 in FIG. 8), the threshold level, which is the object of the verify operation, is decreased stepwise in the last stage of data write (Prog Loop 22 to Prog Loop 37 in FIG. 8). This point will be described later.

As has been described above, as a result, the number of times of verify in the case of the verify skip in this embodiment can be set at, e.g. 304 in total.

The Number of Times of the Verify Operation in the Case of the Normal Verify

Figure 9:
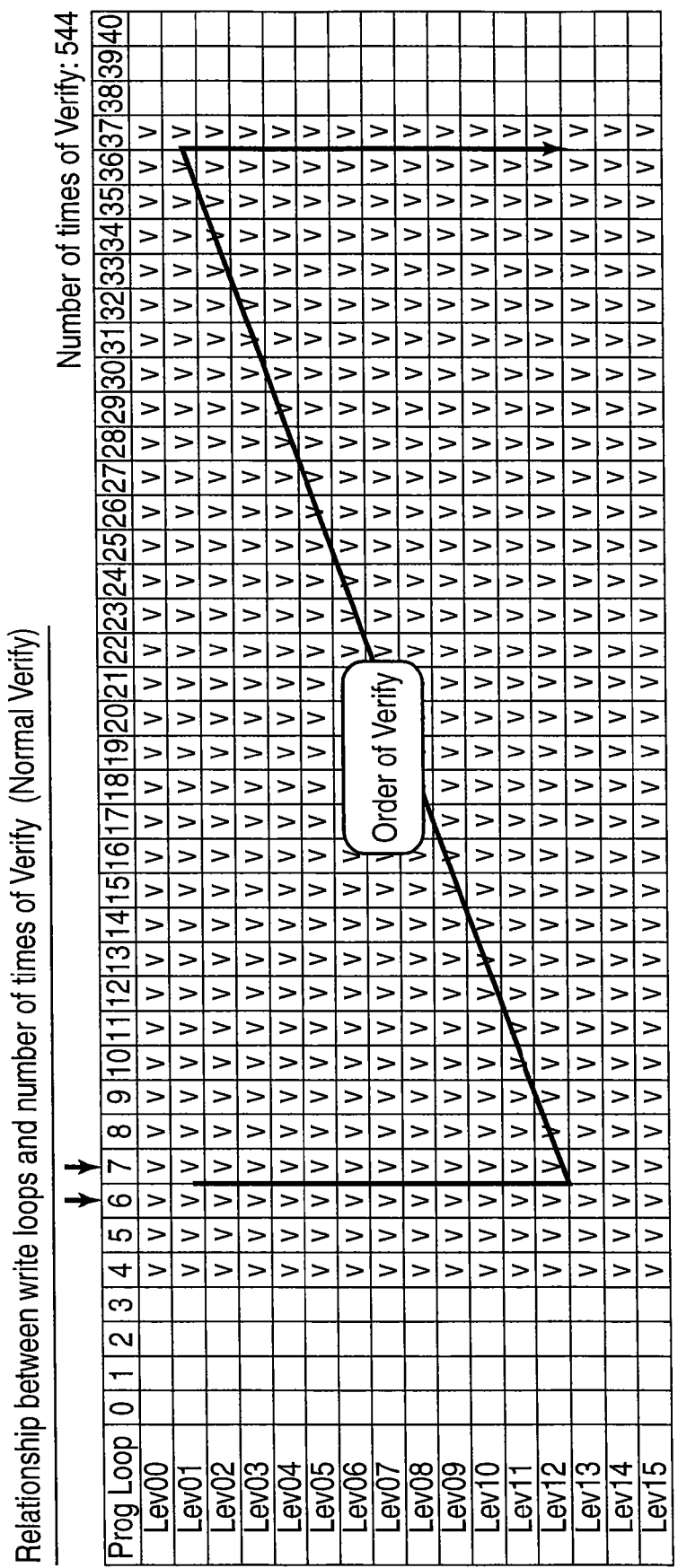
FIG. 9 is a view showing the relationship between the write loops and the number of times of verify in a case of normal skip.

Next, referring to FIG. 9, a description is given of the number of times of verify in the case of executing the normal verify, for the purpose of comparison with the number of times of verify in the case of executing the verify skip. The relationship between the write loop (Program Loop) and the threshold voltage level (Lev00 to lev15) in this case is as shown in FIG. 9.

As shown in FIG. 9, in the normal verify (Normal Verify), the verify operation is executed for all the threshold voltage levels Lev00 to Lev15.

For example, in the fourth program loop (Prog Loop 4), the verify operation is executed for all threshold voltage levels Lev00 to Lev15.

As a result, the number of times of the verify operation in the case of the normal verify increases to 544 in total, and this is disadvantageous in decreasing the program time at the time of the data write operation.

Voltage Waveform of the Select Word Line

Figure 10:
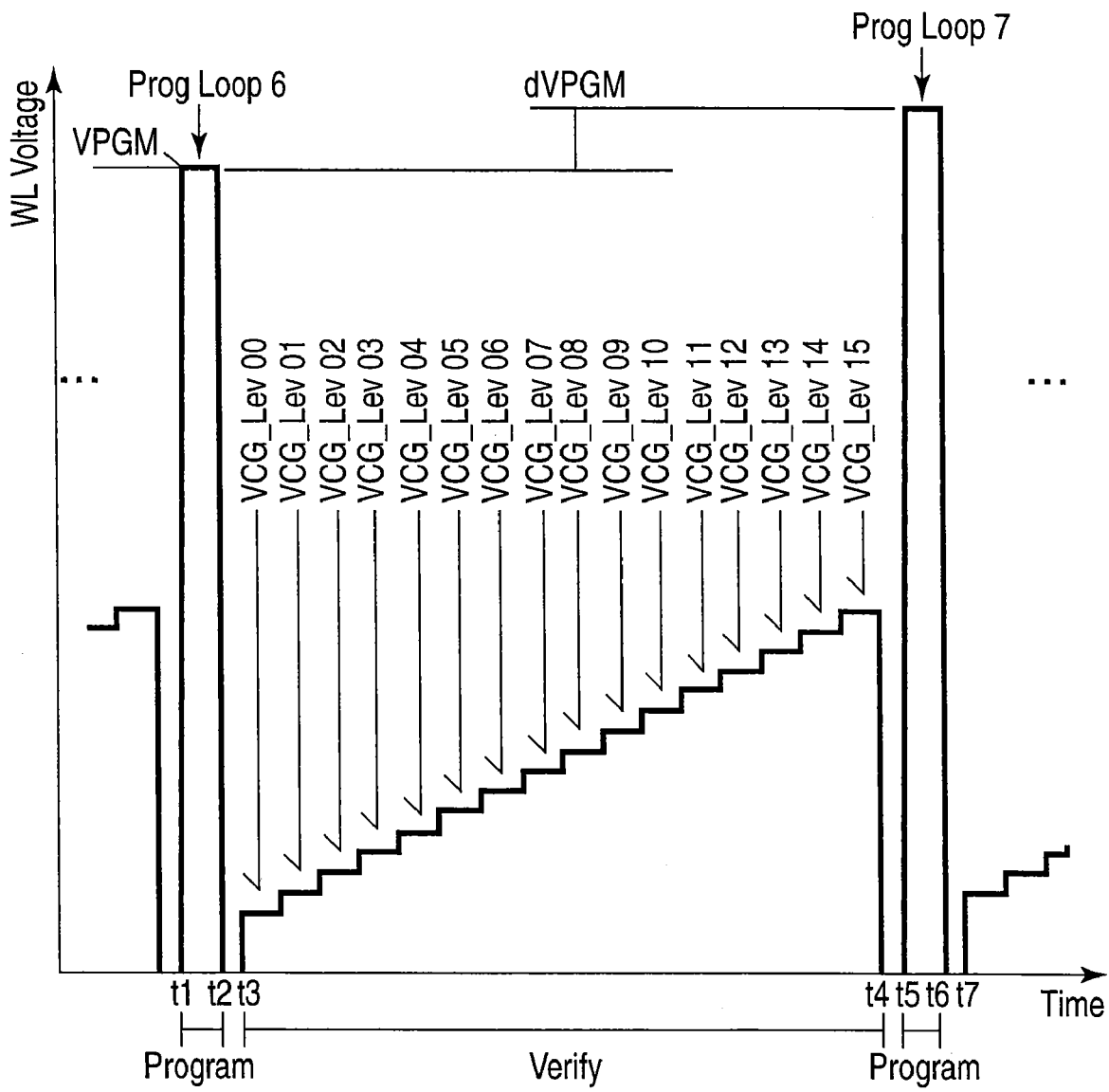
FIG. 10 is a timing chart showing a voltage waveform of a select word line in the case of normal skip.

Further, referring to FIG. 10, the voltage waveform of the select word line in the case of the normal verify is described. The sixth program loop (Prog Loop 6) and seventh program loop (Prog Loop 7), which are indicated by arrows in FIG. 9, are taken as an example.

As shown in FIG. 10, for example, in the sixth program loop (Prog Loop 6), a write voltage VPGM is applied to the select word line from a time point t1 to a time point t2 (Program).

Then, from a time point t3 to a time point t4 (Verify), the verify operation is successively executed for all the threshold voltage levels Lev00 to Lev15.

Subsequently, in the seventh program loop (Prog Loop 7), a write voltage VPGM+dVPGM, which is stepped up from the above-described write voltage VPGM by dVPGM, is applied to the select word line from a time point t5 to a time point t6 (Program).

Then, after a time point t7, like the period between the time point t3 and time point t4, the verify operation is successively executed for all the threshold voltage levels Lev00 to Lev15.

In this manner, the voltage, which is applied to the select word line of the NAND flash memory, is the repetition of the write voltage (Program) and verify voltage (Verify). In the multilevel NAND flash memory, most of the program time is occupied by the verify time, and how to reduce the number of times of verify is important from the standpoint of shortening of the program time (tPROG). In the normal verify, since the verify operation needs to be successively executed for all the threshold voltage levels Lev00 to Lev15, the number of times of verify increases, and this is disadvantageous in reducing the program time.

According to the data write operation by the verify skip in the above-described example, however, a predetermined number of times of verify can be skipped, and this is advantageous in reducing the program time (tPROG).

3. Re: Relationship Between the Number of Times of Data Rewrite and the Number of Times of Verify Next, referring to FIG. 11 to FIG. 16, a description is given of the relationship between the number of times of data rewrite and the number of times of verify.

Figure 11:
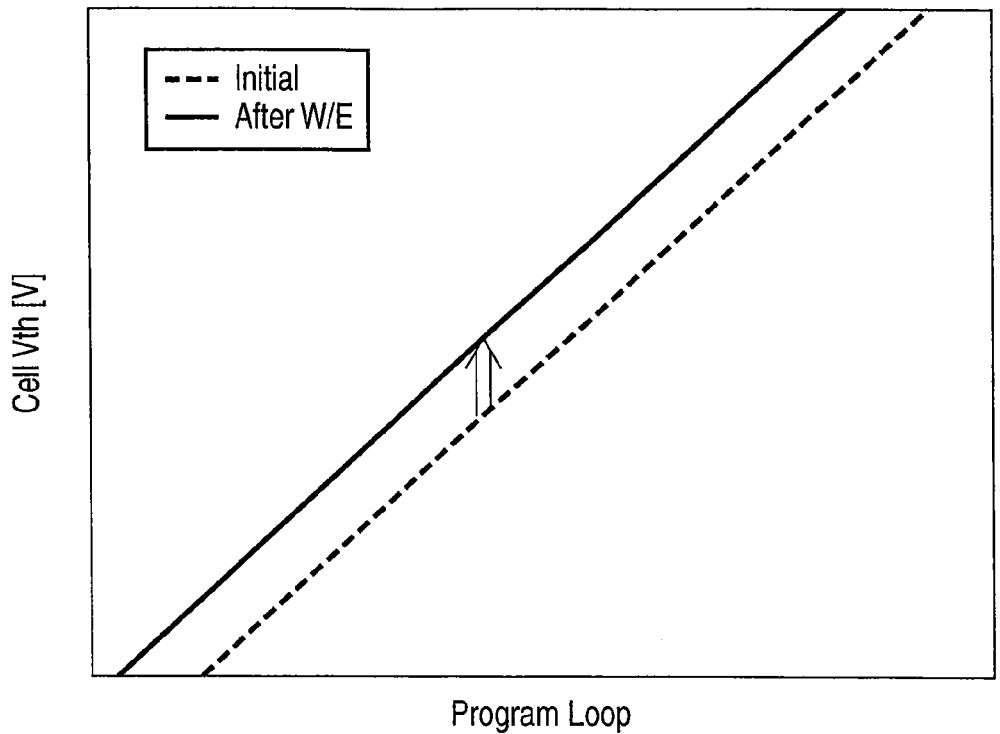
FIG. 11 is a view showing the relationship between the number of program loops and a threshold voltage.

3-1. Relationship Between the Number of Times of Application of Write Voltage and the Threshold Voltage The relationship between the number of times of application of write voltage (Program Loop) and the threshold voltage (Cell Vth) is as shown in FIG. 11. A broken line in FIG. 11 indicates initial characteristics ("Initial") (e.g. at the time of shipment), and a solid line indicates characteristics ("After W/E") after the repetition of data rewrite (data write/erase).

Figure 12:
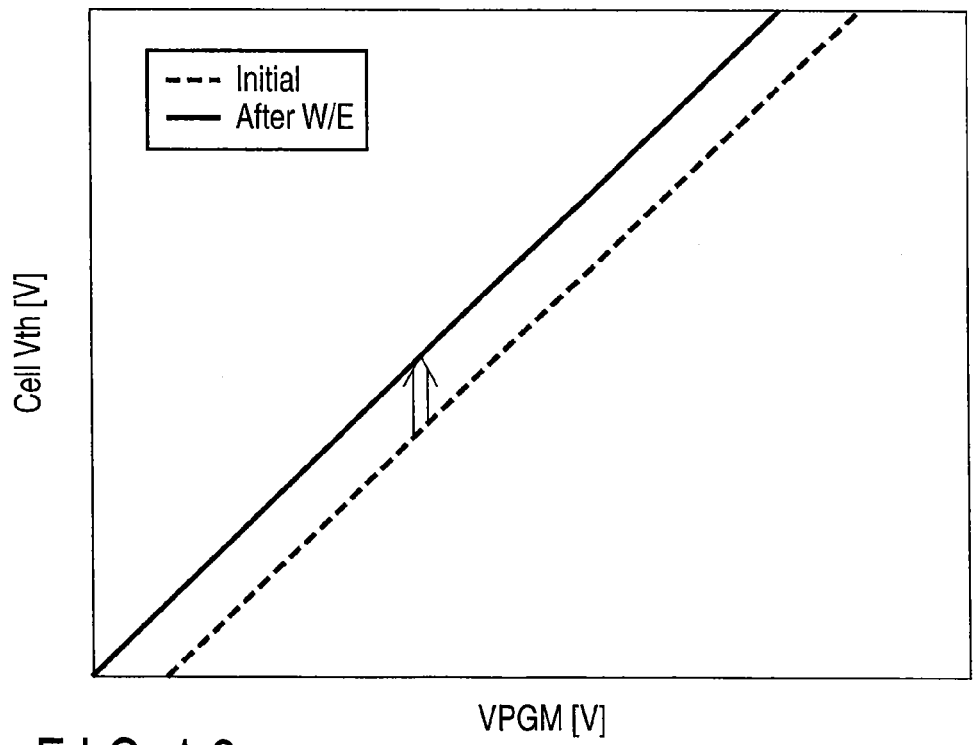
FIG. 12 is a view showing the relationship between a write voltage and a threshold voltage.

As shown in FIG. 12, the write voltage in this case has a value that is stepped up with a fixed width (dVPGM). In FIG. 12, the abscissa in FIG. 11 is changed from the number of times of application of write voltage to the write voltage. As in FIG. 11, a broken line in FIG. 11 indicates initial characteristics (Initial) (e.g. at the time of shipment), and a solid line indicates characteristics (After W/E) after the repetition of data rewrite (data write/erase).

As shown in FIG. 11 and FIG. 12, the relationship between the number of times of application of write voltage and the threshold voltage is proportional (linear), regardless of the initial characteristics (Initial) and the characteristics after data write/erase (After W/E). The reason for this is that the amount of electrons, which are injected in the floating gate electrode by a single data write operation, is uniformized by properly setting the step-up width of the write voltage. Further, it is understood that after the data write/erase (After W/E), the threshold voltage tends to easily rise, with reference to the number of times of application of the same write voltage.

3-2. Re: The Number of Times of Verify

Taking the relation of the above section 3-1 into account, the number of times of verify, which is finally determined, is explained.

Re: Verify State

Figure 13:
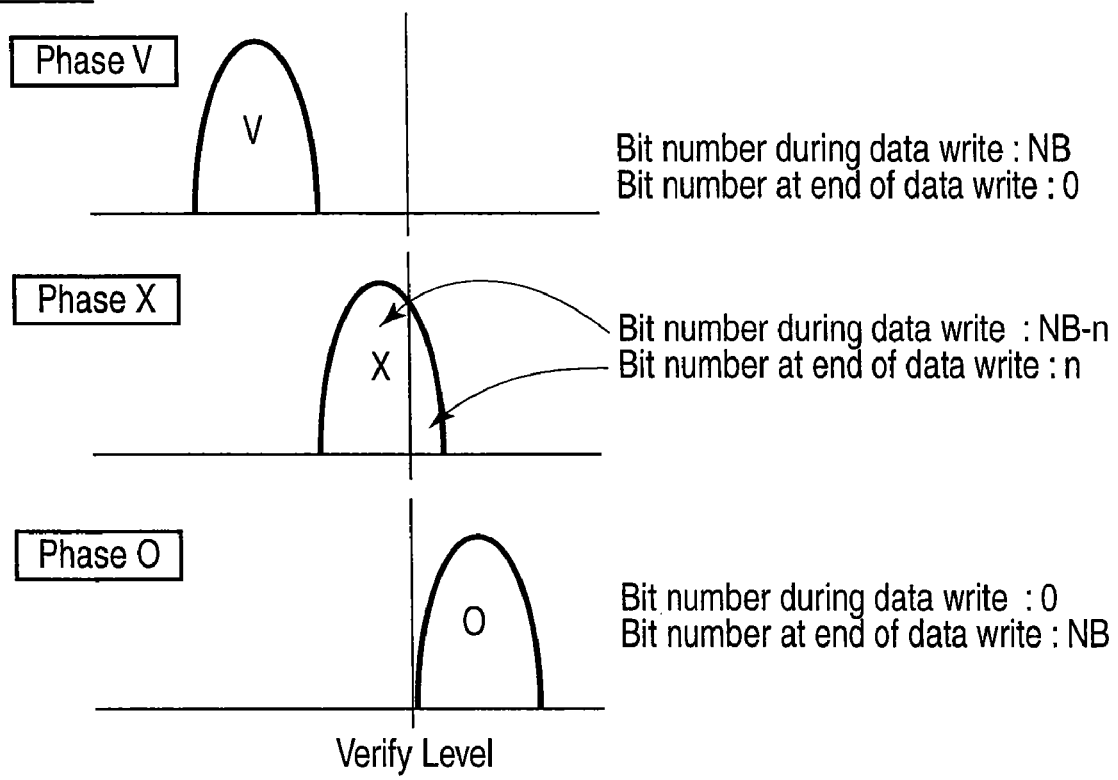
FIG. 13 is a view for explaining a verify state in the first embodiment.

In order to explain the verify state, the verify state is divided into three phases (Phase V to Phase 0) as shown in FIG. 13.

The phase V (Phase V) shown in FIG. 13 is a state prior to the occurrence of a bit at which data write is completed. Specifically, in this phase V (Phase V), in the bit scan circuit 22, for example, the scanning indicates that the number of bits at which a write operation is being executed is $N_B$, and the number of bits at which data write is finished is 0.

Subsequently, the phase X (Phase X) is the state in which data write is being executed. Specifically, in the phase X (Phase X), in the bit scan circuit 22, for example, the scanning indicates that the number of bits at which a write operation is being executed is $N_B$–n, and the number of bits at which data write is finished is n.

Subsequently, the phase O (Phase 0) is the state in which data write is finished. Specifically, in this phase (Phase 0), in the bit scan circuit 22, for example, the scanning indicates that the number of bits at which a write operation is being executed is 0, and the number of bits at which data write is finished is $N_B$.

The Number of Times of Verify in the Case of "Initial"

Figure 14:
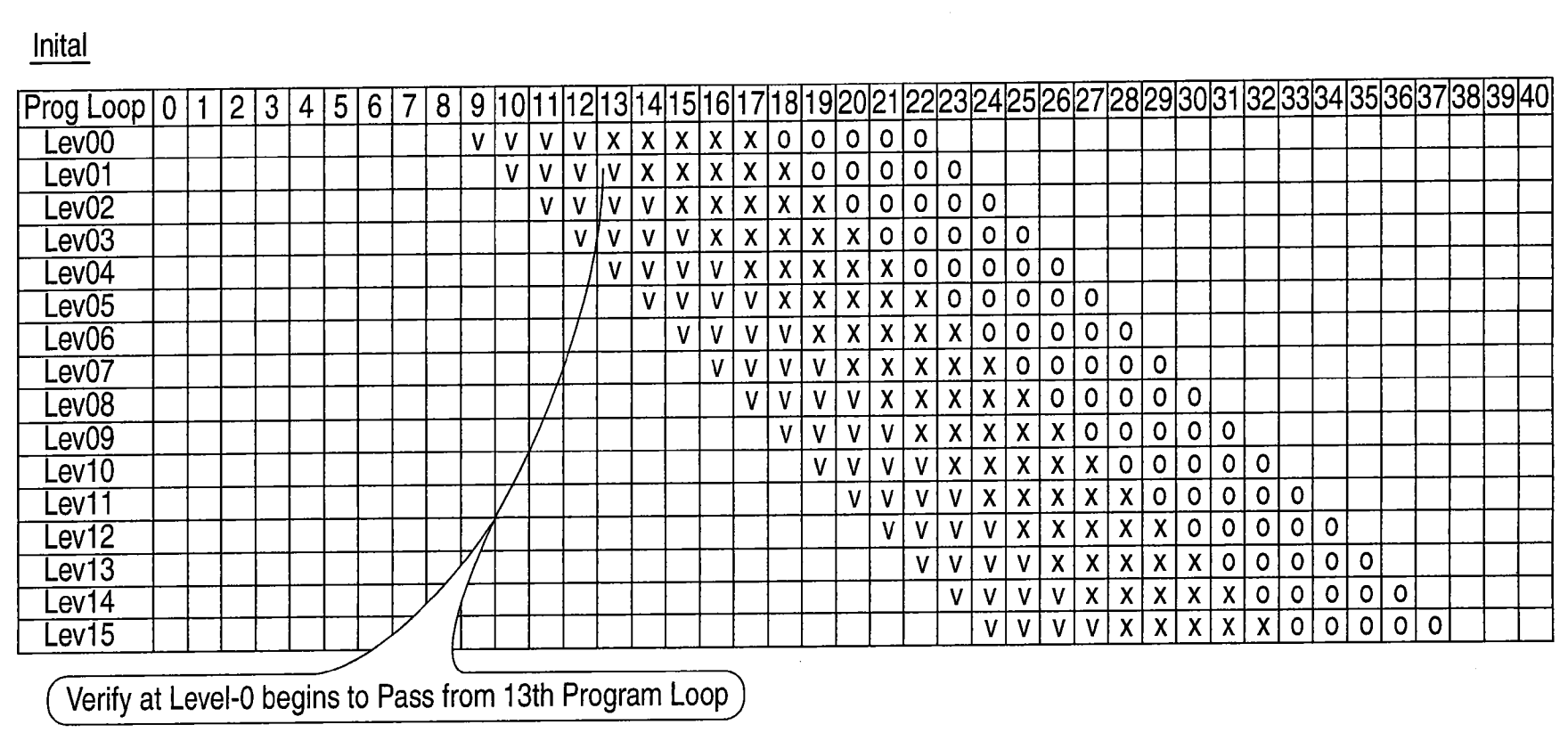

The number of times of verify in the case of "Initial" is as shown in FIG. 14. FIG. 14 shows an example in which the prescribed number $N_L$ is set at $N_L$=8, on the basis of the initial characteristics (Initial) of data write of the memory cell transistor.

As shown in FIG. 14, for example, in the case of "Initial", the verify of the threshold voltage level Lev00 begins to pass (Phase X) from the 13th program loop (Prog Loop 13).

The Number of Times of Verify after Data Write/Erase

The number of times of verify after data write/erase ("After Write/Erase") is, for example, as shown in FIG. 15. FIG. 15 shows an example in which the prescribed number $N_L$ is set at $N_L$=3, on the basis of the write characteristics of the memory cell transistor after data write/erase (After Write/Erase).

As shown in FIG. 15, it is understood that, compared to the case of FIG. 14, the timing of appearance of the bit at which data write is finished shifts in such a direction that the number of program loops is smaller. After the repetition of data write/erase, the write timing becomes earlier due to the variation in cell characteristics, and, for example, the verify of the threshold voltage level Lev00 begins to pass (Phase X) from the ninth program loop (Prog Loop 9).

The Number of Times of Verify that is Finally Determined (Verify Skip)

Taking the variations of cell characteristics shown in FIG. 14 and FIG. 15 into account, the finally determined number of times of verify of the verify operation (Verify Skip) is as shown in FIG. 16.

As shown in FIG. 16, as regards the finally determined number of times of verify, in consideration of the fact that the write timing becomes earlier due to the repetition of data write/erase as shown in FIG. 15, the "Loop Number for starting Verify: Prescribed Number $N_L$" in the above-described step S1-2 needs to be set at a low value.

As described in the above sections 3-1 and 3-2, the verify skip operation, compared to the normal verify operation, is advantageous in that the number of times of verify can be reduced. However, there may be a case in which the number of times of verify increases, since it is necessary to set the verify start point to the lower loop number side in consideration of the cell degradation after data write/erase, and to shift the number of times of verify, as a whole, to the lower side.

An improved verify skip (hereinafter referred to as "Modified Verify Skip"), in which the verify skip that has been described in the above sections 2-1 and 2-2 is improved, is explained in the following sections 4-1 and 4-2.

4. Data Write Operation (Modified Verify Skip)

4-1A. Data Write Operation

Referring to FIG. 17A to FIG. 21, a description is given of the "Modified Verify Skip" in the data write operation of the nonvolatile semiconductor memory device according to the first embodiment. The description below is given with reference to a flow chart of FIG. 17A. The data write operation, which is to be described below, is an improvement (Modified Verify Skip) of the data write operation in the verify skip that has been described in the above sections 2-1 and 2-2.

(Step S2-1 (Program))

Figure 17A:
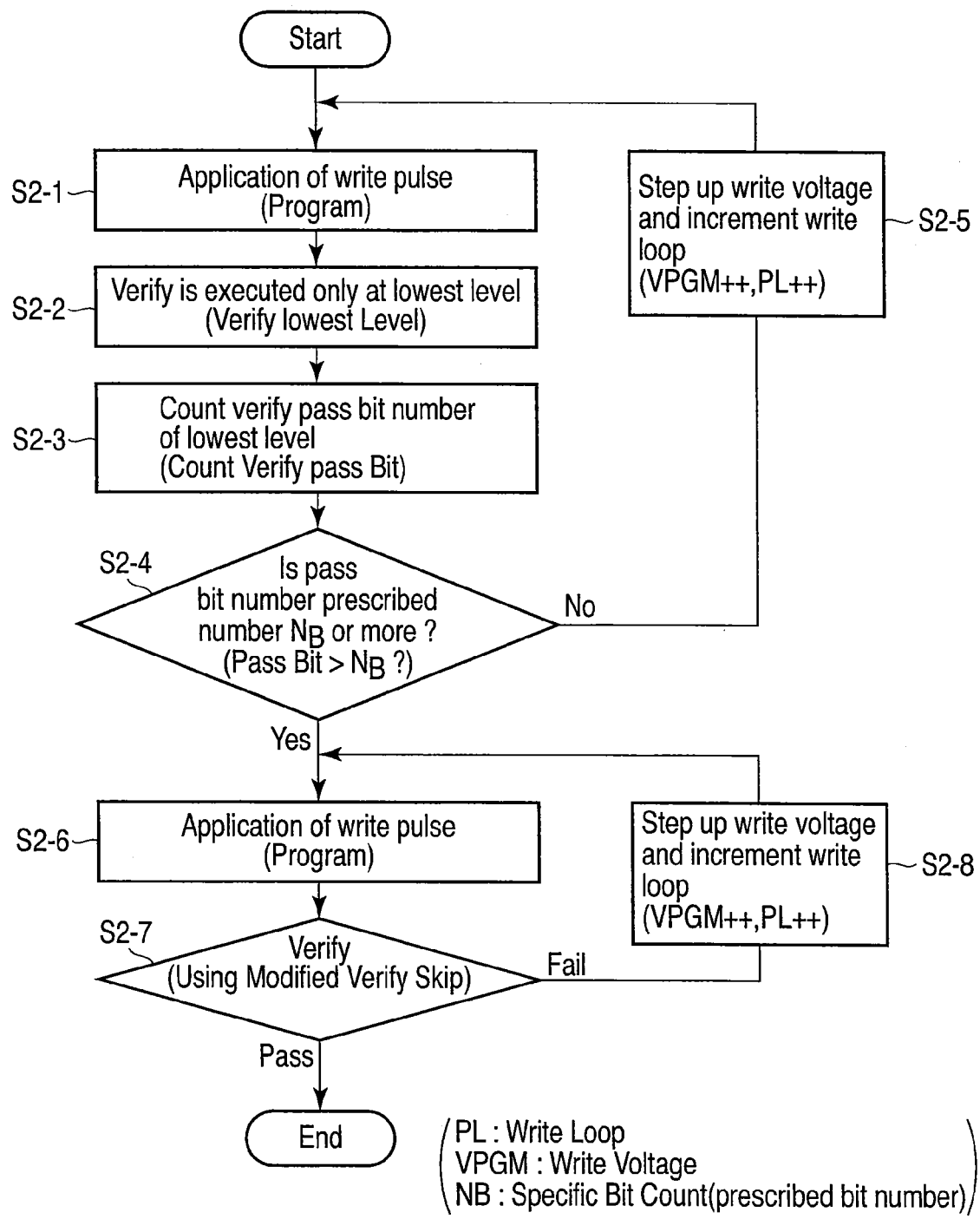
FIG. 17A is a flow chart illustrating data write of the semiconductor memory device according to the first embodiment.

To start with, as shown in FIG. 17A, the control circuit 17 applies a write pulse, on the basis of write data which is input from the external host device via the data input/output terminal 15.

(Step S2-2 (Verify lowest Level))

Subsequently, the control circuit 17 verifies only the lowest threshold voltage level Lev00, and does not execute ("skip") the verify of the other threshold voltage levels Lev00 to Lev15.

(Step S2-3 (Count Verify pass Bit))

Then, the bit scan circuit 22 counts the bit number of the verify pass (Phase X) of the lowest threshold voltage level Lev00.

(Step S2-4 (Pass Bit>$N_B$?))

Subsequently, the control circuit 17 determines whether the verify pass bit number (Pass Bit) of the lowest threshold voltage level Lev00 is the prescribed bit number ($N_B$) or more.

In this step, if the verify pass bit number (Pass Bit) of the lowest threshold voltage level Lev00 is the prescribed bit number ($N_B$) or more (Yes), the process advances to step S2-6.

In the meantime, the value of the prescribed bit number $N_B$ may be a fixed value that is determined at the time of a test step before shipment, or may be a variable value which can be re-set after shipment.

(Step S2-5 (VPGM++, PL++))

If the verify pass bit number (Pass Bit) of the threshold voltage level Lev00 is not the prescribed bit number ($N_B$) or more (No), the control circuit 17 steps up the write voltage VPGM in the same manner as described above, and increments the number of write loops by one, following which the above-described steps S2-1 to S2-3 are executed once again.

(Step S2-6 (Program))

If the verify pass bit number (Pass Bit) of the threshold voltage level Lev00 is the prescribed bit number ($N_B$) or more (Yes), the control circuit 17 applies write pulses on the basis of the write data that is input from the external host device via the data input/output terminal 15.

(Step S2-7 (Using Modified Verify Skip))

Subsequently, the control circuit 17 controls the verify operation, and determines whether the verify operation is completed or not. The improved verify operation (Modified Verify Skip), which is executed at this time, will be described later in detail.

If the verify operation can be completed (Pass), the data write operation is finished.

(Step S2-8 (VPGM++, PL++))

If the verify operation cannot be completed (Fail), the control circuit 17 steps up the write voltage VPGM in the same manner as described above, and increments the number of write loops by one, following which the above-described steps S2-6 to S2-7 are executed once again.

4-1B. Data Write Operation (Modification 2)

Figure 17B:
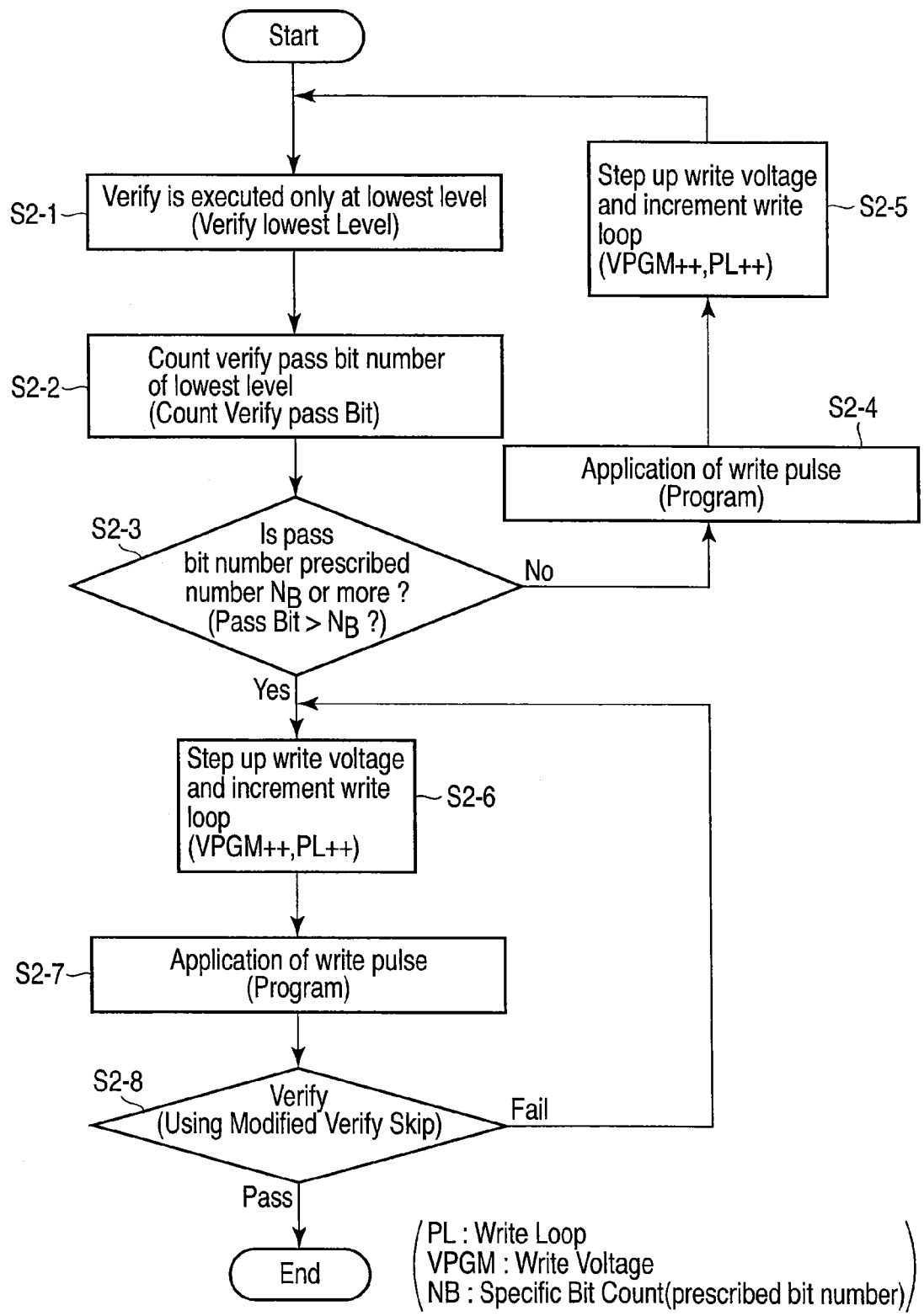
FIG. 17B is a flow chart illustrating data write of the semiconductor memory device according to the modification 2.

Referring to FIG. 17B, a description is given of the "Modified Verify Skip" in the data write operation of the nonvolatile semiconductor memory device according to the modification 2. The description below is given with reference to a flow chart of FIG. 17B.

(Step S2-1 (Verify lowest Level))

To start with, as shown in FIG. 17B, the control circuit 17 verifies only the lowest threshold voltage level Lev00, and does not execute ("skip") the verify of the other threshold voltage levels Lev00 to Lev15.

(Step S2-2 (Count Verify pass Bit))

Then, the bit scan circuit 22 counts the bit number of the verify pass (Phase X) of the lowest threshold voltage level Lev00.

(Step S2-3 (Pass Bit>$N_B$?))

Subsequently, the control circuit 17 determines whether the verify pass bit number (Pass Bit) of the lowest threshold voltage level Lev00 is the prescribed bit number ($N_B$) or more.

In this step, if the verify pass bit number (Pass Bit) of the lowest threshold voltage level Lev00 is the prescribed bit number ($N_B$) or more (Yes), the process advances to step S2-6.

In the meantime, the value of the prescribed bit number $N_B$ may be a fixed value that is determined at the time of a test step before shipment, or may be a variable value which can be re-set after shipment.

(Step S2-4 (Program))

If the verify pass bit number (Pass Bit) of the threshold voltage level Lev00 is not the prescribed bit number ($N_B$) or more (No), the control circuit 17 applies a write pulse, on the basis of write data which is input from the external host device via the data input/output terminal 15.

(Step S2-5 (VPGM++, PL++))

Subsequently, the control circuit 17 steps up the write voltage VPGM in the same manner as described above, and increments the number of write loops by one, following which the above-described steps S2-1 to S2-3 are executed once again.

(Step S2-6 (VPGM++, PL++))

If the verify pass bit number (Pass Bit) of the threshold voltage level Lev00 is the prescribed bit number ($N_B$) or more (Yes), the control circuit 17 steps up the write voltage VPGM in the same manner as described above, and increments the number of write loops by one.

(Step S2-7 (Program))

Subsequently, the control circuit 17 applies write pulses on the basis of the write data that is input from the external host device via the data input/output terminal 15.

(Step S2-8 (using Modified Verify Skip))

Subsequently, the control circuit 17 controls the verify operation, and determines whether the verify operation is completed or not. The improved verify operation (Modified Verify Skip), which is executed at this time, will be described later in detail.

If the verify operation cannot be completed (Fail), the above-described steps S2-6 to S2-7 are executed once again by the control circuit 17. If the verify operation can be completed (Pass), the data write operation is finished (End).

4-2. Improved Verify Skip (Modified Verify Skip)

Next, referring to FIG. 18 to FIG. 21, a detailed description is given of the above-described improved verify skip (Modified Verify Skip).

The Number of Times of Verify in the Improved Verify Operation According to the Present Embodiment (Modified Verify Skip)

Taking into account the variation of cell characteristics shown in FIG. 19 and FIG. 20 which are described later, the number of times of verify of the improved verify operation (Modified Verify Skip) according to the present embodiment is as shown in FIG. 18.

As shown in FIG. 18, for example, as regards the number of times of verify in the modified verify operation according to the present embodiment, the write timing of the data write/erase becomes earlier, and the verify at the lowest threshold voltage level Lev00 begins to pass (Phase X) from the 11th program loop (Prog Loop 11).

As regards the threshold voltage level at which data write is finished, no verify operation is executed thereafter. Specifically, if the verify state transitions to the state O (phase 0) in FIG. 18, no verify operation is executed. For example, since the data write at the lowest threshold voltage level Lev00 is completed in the 17th program loop (Prog Loop 17), no verify operation is executed from the subsequent 18th program loop (Prog Loop 18).

As a result, the number of times of verify in the modified verify skip in this embodiment can be decreased to 107 in total. Thus, compared to the case of the verify skip, the number of times of verify can further be reduced, and the program time (tPROG) can advantageously be reduced.

The Number of Times of Verify in the Case of "Initial"

The number of times of verify in the case of "Initial" is as shown in FIG. 19.

As shown in FIG. 19, for example, in the case of "Initial", the verify of the threshold voltage level Lev00 begins to pass (Phase X) from the 13th program loop (Prog Loop 13).

The number of times of verify in the modified verify skip in this embodiment in the case of "Initial" is 109 in total.

The Number of Times of Verify after Data Write/Erase

The number of times of verify after data write/erase (After Write/Erase) is as shown in FIG. 20.

As shown in FIG. 20, it is understood that, compared to the case of FIG. 19, the write becomes earlier to the lower threshold voltage level side. For example, in the case of the characteristics after the data write/erase, the write timing becomes earlier due to the variation of cell characteristics, which is caused by the data write/erase, and the verify at the threshold voltage level Lev00 begins to pass (Phase X) from the ninth program loop (Prog Loop 9).

The number of times of verify in the case of the modified verify skip after the data write/erase in this embodiment is 105 in total.

As described above, according to the modified verify skip, even in the case where the write timing becomes earlier due to the variation of cell characteristics, which is caused by the data write/erase, it is possible to suppress the increase in the final number of times of verify.

Voltage Waveform of the Select Word Line

Figure 21:
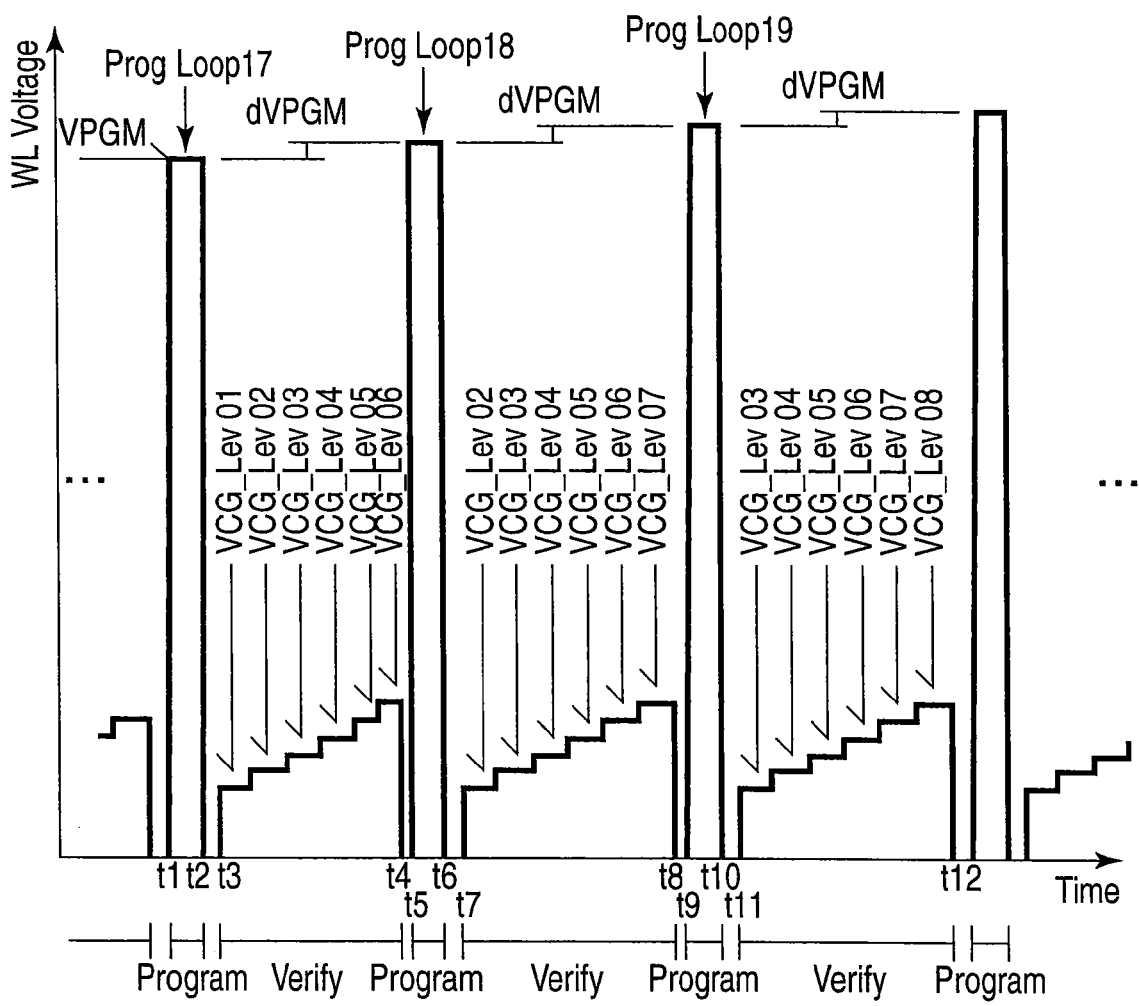
FIG. 21 is a timing chart showing a voltage waveform of a select word line in the improved verify skip.

Further, referring to FIG. 21, the voltage waveform of the select word line in the case of the modified verify skip is described. The 17th program loop (Prog Loop 17) and 19th program loop (Prog Loop 19), which are indicated by arrows in FIG. 18, are taken as an example.

As shown in FIG. 21, for example, in the 17th program loop (Prog Loop 17), a write voltage VPGM is applied to the select word line from a time point t1 to a time point t2 (Program).

Then, from a time point t3 to a time point t4 (Verify), the verify operation is successively executed for all the six threshold voltage levels Lev01 to Lev06.

Subsequently, in the 18th program loop (Prog Loop 18), a write voltage VPGM+dVPGM, which is stepped up from the above-described write voltage VPGM by dVPGM, is applied to the select word line from a time point t5 to a time point t6 (Program).

Then, from a time point t7 to a time point t8 (Verify), the verify operation is successively executed for all the six threshold voltage levels Lev02 to Lev07.

Subsequently, in the 19th program loop (Prog Loop 19), a write voltage VPGM+2×dVPGM, which is stepped up from the above-described write voltage VPGM by 2×dVPGM, is applied to the select word line from a time point t9 to a time point t10 (Program).

Then, from a time point t11 to a time point t12 (Verify), the verify operation is successively executed for all the six threshold voltage levels Lev03 to Lev08.

In this manner, since the verify time, which occupies most of the program time, can be decreased, it is obvious that the program time (tPROG) can be made shorter than in the case of the normal verify shown in FIG. 10.

In addition, the program time (tPROG) can more advantageously be reduced since a predetermined number of times of verify can be omitted ("Skip"), even in the case where the write timing becomes earlier than in the above-described verify skip due to the variation of the cell characteristics by the data write/erase.

5. Advantageous Effects of the First Embodiment

At least the following advantageous effects (1) and (2) can be obtained by the semiconductor memory device according to the first embodiment and the data write method thereof.

(1) The program time (tPROG) can advantageously be reduced.

(1)-1. Re: Verify Skip

As has been described above, in the semiconductor memory device according to the first embodiment, at the time of the step S1-2, the control circuit 17 determines whether the number of times of application of write pulses, PL, is the prescribed number $N_L$ or not, in accordance with the relationship between the number of program loops and the threshold voltage level for verify, which is shown in FIG. 16. Then, the control circuit 17 executes control to perform the verify operation (Verify Skip) for skipping predetermined verify operations.

For example, as shown in FIG. 8, compared to the normal verify (Normal Verify) in which a verify operation is executed for all threshold voltage levels, Verify VC1 and Verify VC2, which are indicated by broken lines in FIG. 8, can be omitted ("Skip").

For example, in the case of the present embodiment, under the supposition that the write at the threshold voltage level Lev00 will be finished from the fourth program loop (Prog Loop 4), a verify operation is executed for only the threshold voltage level Lev00 at the fourth program loop. On the other hand, at this time, the verify operation for the other threshold voltage levels Lev01 to Lev15 is not executed and is skipped.

For example, in the same manner as described above, at the time of the fifth program loop (Prog Loop 5), the verify operation is executed for only the threshold voltage levels Lev00 and Lev01. On the other hand, at this time, the verify operation for the other threshold voltage levels Lev02 to Lev15 is not executed and is skipped.

For example, at the time of the eighth program loop (Prog Loop 8), the verify operation is executed for the threshold voltage levels Lev00 to Lev04. On the other hand, the verify operation for the other threshold voltage levels Lev05 to Lev15 is not executed and can be skipped.

Subsequently, in the same manner as described above, as the number of program loops increases, the threshold level for the verify operation is increased.

As a result, as described above, the number of times of verify in the verify skip in this embodiment can be set at, e.g. 309 in total.

On the other hand, in the normal verify (Normal Verify), the verify operation needs to be executed for all threshold voltage levels Lev00 to Lev15. Thus, the number of times of verify increases to 544 in total, and this is disadvantageous in shortening the program time.

As shown in FIG. 10, the voltage, which is applied to the select word line at the time of data write, is the repetition of the write voltage (Program) and verify voltage (Verify). In the multilevel NAND flash memory, most of the program time is occupied by the verify time, and how to reduce the number of times of verify is important from the standpoint of shortening of the program time. In the normal verify, since the verify operation needs to be successively executed for all the threshold voltage levels Lev00 to Lev15, the number of times of verify increases, and this is disadvantageous in reducing the program time.

However, according to the data write operation by the above-described verify skip, since a predetermined number of times of verify can be omitted ("Skip"), the program time (tPROG) can advantageously be reduced.

(1)-2. Re: Modified Verify Skip

The verify skip operation in the above section (1)-1, compared to the normal verify operation, is advantageous in that the number of times of verify can be reduced. However, in some cases, the number of times of verify may increase by such a degree that the verify start point has to be set to the lower loop number side in consideration of the cell degradation after data write/erase.

In the modified verify skip which has been improved in consideration of the above point, the following steps are performed.

(I) In step S2-2, according to the relationship shown in FIG. 18, the control circuit 17 executes control to start the verify from the first program loop (Prog Loop 1) with respect to only the lowest threshold voltage level (Lev00 in the present example), and skips the verify of the other threshold voltage levels (Lev01 to Lev15 in this example).

(II) Then, in step S2-3, the bit scan circuit 22 counts the bit number of the verify pass (Phase X) of the lowest threshold voltage level Lev00. In the subsequent step S2-4, on the basis of the count number of the bit scan circuit 22, the control circuit 17 determines whether the verify pass bit number (Pass Bit) of the lowest threshold voltage level Lev00 is the prescribed bit number ($N_B$) or more.

(III) In step S2-6, if the verify pass bit number (Pass Bit) of the threshold voltage level Lev00 is the prescribed bit number ($N_B$) or more (Yes), the control circuit 17 applies write pulses on the basis of the write data that is input from the external host device via the data input/output terminal 15. In step S2-7, the verify of the next threshold voltage level (Lev01 in this example) is started from the next program loop.

(IV) Subsequently, in step S2-7, the end of verify at each threshold voltage level is detected. If the verify is finished, the subsequent verify operation is skipped ("Skip").

In the verify operation according to the modified verify skip, as shown in FIG. 18, regardless of "Initial" (FIG. 19) and "After W/E" (FIG. 20), the optimal number of times of verify can automatically be selected, the write speed can be increased and stabilized, and therefore the reliability can be enhanced.

For example, in the case of the present embodiment, as shown in FIG. 18, the verify number in the modified verify skip can be set at 109 in total. Thus, compared to the above-described verify skip, the number of times of verify can further be reduced, and the program time can advantageously be shortened.

In the modified verify skip according to this embodiment, as shown in FIG. 18, the number of times of verify and the verify start point can be adjusted in the verify operation in accordance with the write speed of the memory transistor. By this modified verify skip, the number of times of verify of the NAND flash memory can greatly be reduced, and the program speed (MB/sec) can be improved.

Since the number of times of verify and the verify start point can be determined as shown in FIG. 18, if it can be confirmed by the bit scan circuit 22 that the pass bit number of the lowest threshold voltage level (Lev00 in this example) is the prescribed bit number $N_B$ or more (steps S2-2 to S2-4), then it should suffice to execute verify in an inverted N shape by making use of the characteristics of the threshold voltage, which are shown in FIG. 11 and FIG. 12. The inverted N shape refers to a voltage waveform in such a series of operations that after program pulses are applied, verify pulses are applied stepwise in accordance with threshold voltage levels, and then the stepped-up program pulses are applied, as shown in FIG. 9 and FIG. 10. For example, as shown in FIG. 10, in the sixth program loop (Prog Loop 6), the write voltage pulse VPGM is applied to the select word line from time point t1 to time point t2 (Program). Subsequently, the verify pulse is successively applied with respect to all the threshold voltage levels Lev00 to Lev15 during the period (Verify) between time point t3 and time point t4. Then, in the seventh program loop (Prog Loop 7), the stepped-up write voltage pulse VPGM+dVPGM is applied during the period (Program) between time point t5 and time point t6.

(2) The multilevel implementation can advantageously be achieved.

With the development of the multilevel implementation of the memory, the number of threshold levels, which require the verify operation, increases, for example, as shown in FIG. 10. As shown in FIG. 10, in the multilevel NAND flash memory, most of the program time is occupied by the verify time.

However, as has been described in the above sections (1)-1 and (2)-2, according to the first embodiment, the number of times of verify can be reduced while the reliability can be maintained.

Therefore, the multilevel implementation of the memory can advantageously be achieved.

SECOND EMBODIMENT

An Example in which Data Write is Executed from a Central Threshold Voltage Level Side)

Next, referring to FIG. 22 to FIG. 25, a description is given of a semiconductor memory device according to a second embodiment of the invention and a data write method thereof.

This embodiment relates to an example in which the control circuit 17 executes control to perform data write from a threshold voltage level (the central 8th value Lev08 in this example) side, which is higher than the lowest threshold voltage level (Lev00) of the multilevel data (16 values Lev00 to Lev15 in this example). In this description, a detailed description of the parts common to those in the first embodiment is omitted.

6. Data Write Operation

Referring to FIG. 22 to FIG. 26, a description is given of the data write operation of the semiconductor memory device according to the second embodiment.

Figure 22:
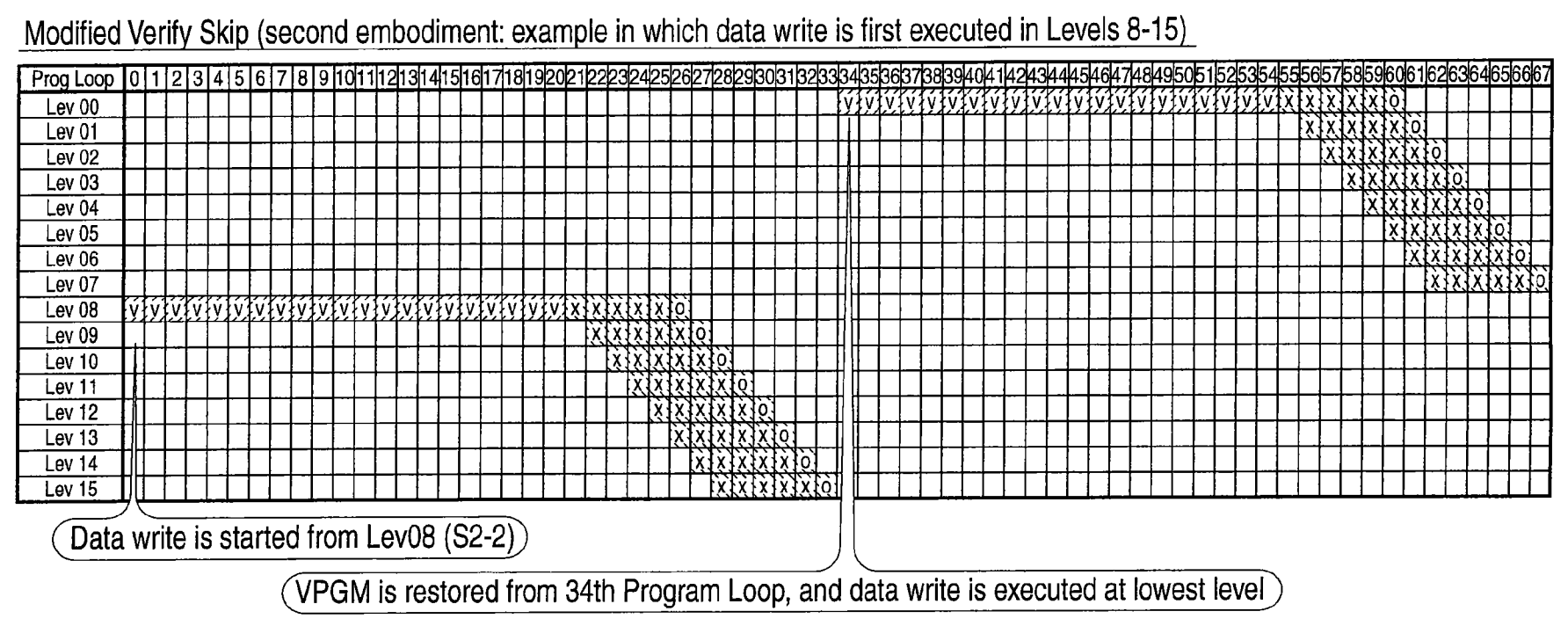

The second embodiment differs from the first embodiment in that in the above-described step S2-2, the data write is started at the threshold voltage level Lev08 that is the central value, as indicated at the 0th program loop (Prog Loop0) in FIG. 22.

Figure 23:
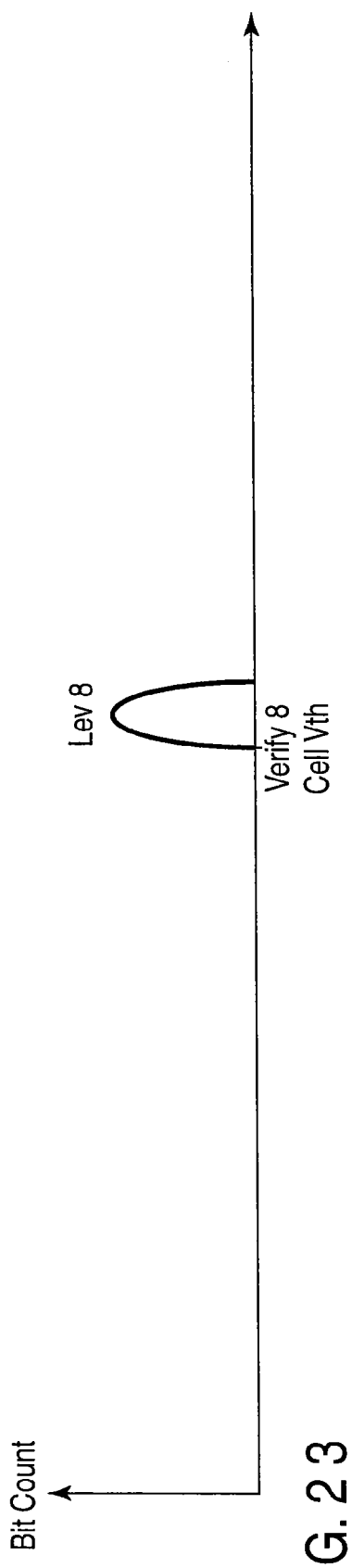
FIG. 23 is a view showing a threshold value distribution in one write loop of the semiconductor memory device according to the second embodiment.

Then, as shown in FIG. 23, the verify is executed only at the threshold voltage level Lev08 from the first program loop (Prog Loop 1) to the 20th program loop (Prog Loop 20). On the other hand, between the first program loop (Prog Loop 1) and the 20th program loop (Prog Loop 20), the verify operation is not executed ("Skip") for the other threshold voltage levels Lev00 to Lev07, and Lev09 to Lev15.

Figure 24:
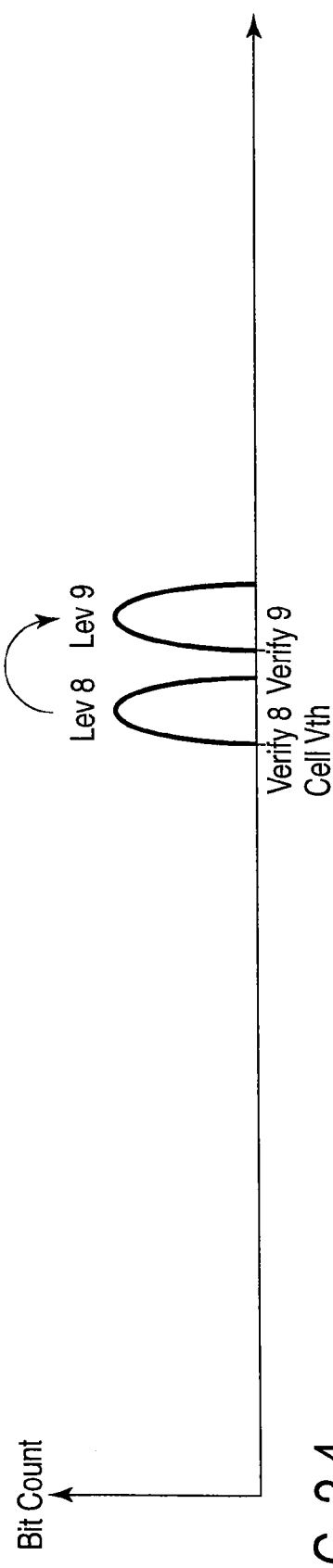
FIG. 24 is a view showing a threshold value distribution in one write loop of the semiconductor memory device according to the second embodiment.

Subsequently, as shown in FIG. 24, in the 22nd program loop (Prog Loop 22), the verify is executed for the threshold voltage levels Lev08 and Lev09. The verify operation is not executed ("Skip") for the other threshold voltage levels Lev00 to Lev07, and Lev10 to Lev15, as in the above-described case.

Subsequently, in the similar manner as described above, the verify operation for the threshold voltage level Lev15 is first executed until the 33rd program loop (Prog Loop 33).

Then, as shown in FIG. 25, the verify is executed only at the lowest threshold voltage level Lev00 from the 34th program loop (Prog Loop 34). The verify operation is not executed ("Skip") for the other threshold voltage levels Lev01 to Lev15. At this time, for example, the verify is executed by restoring the write voltage VPGM to about 10 V, which corresponds to the lowest threshold voltage level Lev00. At this time, in the above-described step S2-7, even in the case where the verify for the threshold voltage level Lev15 has passed, the data write is not finished, and the operation of the step S2-2 is started. In this respect, the second embodiment differs from the first embodiment.

Subsequently, the same data write operation as in the first embodiment is executed from the 35th program loop (Prog Loop 35).

As a result, as shown in FIG. 26, at the 67th program loop (Prog Loop 67), 16-value multilevel data having a desired threshold voltage distribution can be written.

7. Advantageous Effects

As has been described above, at least the same advantageous effects (1) and (2) as described above can be obtained by the semiconductor memory device according to the second embodiment and the data write method thereof.

Furthermore, the second embodiment differs from the first embodiment in that the control circuit 17 executes control to perform data write from the central threshold voltage level (the 8th value Lev08 in this example) side of the multilevel data (16 values Lev00 to Lev15 in this example).

Thus, more advantageously, the data retention characteristics of the low threshold voltage levels (Lev00 to Lev07 in this example) at which data write is executed later can be improved.

This control is applicable as needed.

In the second embodiment, the case in which data write is executed from the threshold voltage level Lev08, which corresponds to the central value, is taken as an example, but the invention is not limited to this example. Specifically, it should suffice if the data write is started from a threshold voltage level side, which is higher than the lowest threshold voltage level (Lev00). For example, the scope of the second embodiment covers the case in which the data write is started from the threshold voltage level Lev10 or the highest threshold voltage level (Lev15 in this example).

In the above description, 16 values have been described as an example of multilevel values, but the invention is not limited to this example. The invention is similarly applicable to not only the 16-value NAND flash memory, but also 4-value or 8-value NAND flash memories, and the same advantageous effects can be obtained. Besides, the invention is applicable to not only the multilevel NAND flash memory, but also single-level NAND flash memory (SLC: single-level cell) which can store 1-bit data in one memory cell transistor.

In the embodiments, data write of random data has mainly been described. However, the invention is applicable to the case of data write of specific data (e.g. write of only "LevF" data).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A semiconductor memory device comprising:
a memory cell array including a plurality of memory cells, each of the memory cells being capable of holding multi-level data; and
a control circuit configured to perform a program cycle including a plurality of program loops, each of the program loops involving a first operation supplying a program voltage and a second operation supplying a verify voltage to be supplied to a gate of a selected memory cell, each of the program cycles involving a first phase, a second phase, and a third phase, the control circuit being configured to perform the second operation after performing the first operation in each of the program loops, the control circuit being configured to supply a first verify voltage without supplying a second verify voltage in the first phase, the control circuit being configured to supply the first verify voltage and the second verify voltage larger than the first verify voltage in the second phase, and the control circuit being configured to supply the second verify voltage without supplying the first verify voltage in the third phase.
2. The device according to claim 1, wherein the plurality of memory cells are electrically connected to a plurality of word lines, the control circuit is configured to supply a first program voltage to a selected word line including the selected memory cell in the first operation of the first phase, the control circuit is configured to supply only a first verify voltage to the selected word line in the second operation of the first phase, the control circuit is configured to supply a second program voltage larger than the first program voltage to the selected word line in the first operation of the second phase, the control circuit is configured to supply the first verify voltage and the second verify voltage to the selected word line in the second operation of the second phase, the control circuit is configured to supply a third program voltage larger than the second program voltage to the selected word line in the first operation of the third phase, and the control circuit is configured to supply the second verify voltage to the selected word line in the second operation of the third phase.

3. The device according to claim 1, further comprising:
a select transistor electrically connected to a group of the memory cells in series, the select transistor including a gate electrode and an inter-gate insulation film, a first portion of the gate electrode being electrically connected to a second portion of the gate electrode via an opening of the inter-gate insulation film.

4. The device according to claim 2, further comprising:
a select transistor electrically connected to a group of the memory cells in series, the select transistor including a gate electrode and an inter-gate insulation film, a first portion of the gate electrode being electrically connected to a second portion of the gate electrode via an opening of the inter-gate insulation film.

5. The device according to claim 1, wherein each memory cells is capable of holding data equal to or more than 4-level data.

6. The device according to claim 2, wherein each of the memory cells is capable of holding data equal to or more than 4-level data.

7. The device according to claim 1, further comprising a bit line control circuit coupled to the memory cell array, the bit line control circuit including a page buffer coupled to the memory cell array and a cache memory coupled to the page buffer and a column decoder.

8. The device according to claim 2, further comprising a bit line control circuit coupled to the memory cell array, the bit line control circuit including a page buffer coupled to the memory cell array and a cache memory coupled to the page buffer and a column decoder.

9. The device according to claim 3, wherein the select transistor including a gate cap layer above the gate electrode.

10. The device according to claim 4, wherein the select transistor includes a gate cap layer above the gate electrode.

11. A semiconductor memory device comprising:
a memory cell array including a plurality of memory cells, each of the memory cells being capable of holding multi-level data; and
a control circuit configured to perform a program cycle including a plurality of program loops, each of the program loops involving a first operation supplying a program voltage and a second operation supplying a verify voltage to be supplied to a gate of a selected memory cell, each of the program cycles involving a first phase, a second phase, a third phase, a fourth phase, and a fifth phase, the control circuit being configured to perform the second operation after performing the first operation in each of the program loops, the control circuit being configured to supply a first verify voltage without supplying a second verify voltage and a third verify voltage, in the first phase, the second verify voltage being larger than the first verify voltage, and the third verify voltage being larger than the second verify voltage, the control circuit being configured to supply the first verify voltage and the second verify voltage without supplying the third verify voltage in the second phase, the control circuit being configured to supply the first verify voltage, the second verify voltage, and a the third verify voltage in the third phase, the control circuit being configured to supply the second verify voltage and the third verify voltage without supplying the first verify voltage in the fourth phase, and the control circuit being configured to supply the third verify voltage without supplying the first and the second verify voltages in the fifth phase.

12. The device according to claim 11, further comprising:
a select transistor electrically connected to a group of the memory cells in series, the select transistor including a gate electrode and an inter-gate insulation film, a first portion of the gate electrode being electrically connected to a second portion of the gate electrode via an opening of the inter-gate insulation film.

13. The device according to claim 11, wherein each memory cells is capable of holding data equal to or more than 4-level data.

14. The device according to claim 11, further comprising a bit line control circuit coupled to the memory cell array, the bit line control circuit including a page buffer coupled to the memory cell array and a cache memory coupled to the page buffer and a column decoder.

15. A semiconductor memory device comprising:
a memory cell array including a plurality of memory cells, each of the memory cells being capable of holding multi-level data, the plurality of memory cells are electrically connected to a plurality of word lines; and
a control circuit configured to supply a first program voltage to a selected word line, the control circuit being configured to supply a first verify voltage to the selected word line, without supplying a second verify voltage, after supplying the first program voltage, the control circuit being configured to supply a second program voltage larger than the first program voltage to the selected word line after supplying the first verify voltage, the control circuit being configured to supply the first verify voltage to the selected word line after supplying the second program voltage, and the control circuit being configured to supply the second verify voltage larger than the first verify voltage to the selected word line after supplying the first verify voltage.

16. The device according to claim 15, wherein the control circuit is configured to supply a third program voltage larger than the second program voltage to the selected word line after supplying the second verify voltage, the control circuit is configured to supply a first verify voltage to the selected word line after supplying the third program voltage, the control circuit is configured to supply the second verify voltage to the selected word line after supplying the first verify voltage, and the control circuit is configured to supply a third verify voltage larger than the second verify voltage to the selected word line after supplying the second verify voltage.

17. The device according to claim 16, further comprising a bit line control circuit coupled to the memory cell array, the bit line control circuit including a page buffer coupled to the memory cell array and a cache memory coupled to the page buffer and a column decoder.

18. The device according to claim 17, wherein the select transistor includes a gate cap layer above the gate electrode.

\* \* \* \* \*